(12) United States Patent
Hur et al.

(10) Patent No.: US 11,317,540 B2
(45) Date of Patent: Apr. 26, 2022

(54) SOLID STATE DRIVE APPARATUS AND DATA STORAGE APPARATUS INCLUDING THE SAME

(71) Applicant: SAMSUNG ELECTRONICS CO., LTD., Suwon-si (KR)

(72) Inventors: Sungchul Hur, Yongin-si (KR); Jaehong Park, Suwon-si (KR); Bumjun Kim, Seoul (KR); Yusuf Cinar, Yongin-si (KR); Hanhong Lee, Suwon-si (KR); Youngseok Hong, Hwaseong-si (KR); Doil Kong, Hwaseong-si (KR); Jaeheon Ma, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/985,290

(22) Filed: Aug. 5, 2020

(65) Prior Publication Data
US 2021/0092871 A1     Mar. 25, 2021

(30) Foreign Application Priority Data

Sep. 20, 2019  (KR) .......................... 10-2019-0116364
Dec. 26, 2019  (KR) .......................... 10-2019-0175496

(51) Int. Cl.
*H05K 7/20*     (2006.01)
*H05K 1/02*     (2006.01)
*G11B 33/14*    (2006.01)

(52) U.S. Cl.
CPC ..... *H05K 7/20436* (2013.01); *G11B 33/1426* (2013.01); *H05K 1/0201* (2013.01); *H05K 1/0203* (2013.01); *H05K 7/20163* (2013.01); *G11B 33/142* (2013.01)

(58) Field of Classification Search
CPC ........... H05K 7/20154; H05K 7/20163; H05K 7/20436; H05K 1/0201; H05K 1/0203; H05K 7/20918; G11B 33/142
See application file for complete search history.

(56) References Cited

U.S. PATENT DOCUMENTS

| | | | |
|---|---|---|---|
| 5,604,665 A * | 2/1997 | Chrysler | H01L 23/467 165/908 |
| 5,781,411 A | 7/1998 | Feenstra | |
| 7,487,822 B2 | 2/2009 | Chrysler | |
| 8,451,600 B1 * | 5/2013 | Ross | B23P 15/26 361/679.47 |

(Continued)

FOREIGN PATENT DOCUMENTS

| KR | 10-2013-0076961 | 7/2013 |
|---|---|---|
| KR | 10-1319584 | 10/2013 |

(Continued)

*Primary Examiner* — Robert J Hoffberg
(74) *Attorney, Agent, or Firm* — F. Chau & Associates, LLC

(57) ABSTRACT

A solid state drive (SSD) apparatus includes a case including an air tunnel disposed between an inner plate and an upper wall and an accommodation space between the inner plate and a lower wall. The air tunnel extends in a first direction, and both end parts of the air tunnel are exposed to the outside. A substrate is disposed in the accommodation space. At least one semiconductor chip is disposed on the substrate.

6 Claims, 41 Drawing Sheets

(56) References Cited

U.S. PATENT DOCUMENTS

| | | | |
|---|---|---|---|
| 9,317,081 B2* | 4/2016 | Mundt | G11B 33/128 |
| 9,485,851 B2* | 11/2016 | Ellis | G11B 33/142 |
| 9,609,739 B2* | 3/2017 | Kamimura | H05K 5/0213 |
| 9,694,451 B1* | 7/2017 | Ross | B23P 15/26 |
| 9,754,857 B2 | 9/2017 | Tracey et al. | |
| 9,841,793 B2* | 12/2017 | Kwon | G11B 33/1426 |
| 9,898,056 B2 | 2/2018 | Dean et al. | |
| 9,958,914 B2* | 5/2018 | Kim | G06F 1/20 |
| 10,006,621 B2 | 6/2018 | Xue et al. | |
| 10,085,364 B2 | 9/2018 | Voss | |
| 10,289,174 B2* | 5/2019 | Kim | G06F 1/20 |
| 10,314,160 B2* | 6/2019 | Suzuki | H05K 1/0203 |
| 10,524,390 B2* | 12/2019 | Suzuki | H05K 7/20136 |
| 10,582,644 B1* | 3/2020 | Hur | H05K 7/20409 |
| 10,682,773 B2* | 6/2020 | Wagner | H01L 23/467 |
| 10,798,839 B2* | 10/2020 | Gao | H05K 7/20418 |
| 10,852,785 B2* | 12/2020 | Mundt | G11B 33/02 |
| 10,869,383 B2* | 12/2020 | Suzuki | H05K 1/18 |
| 10,937,464 B2* | 3/2021 | Long | G11B 33/142 |
| 2014/0055944 A1 | 2/2014 | McCabe et al. | |
| 2014/0153181 A1 | 6/2014 | Peng et al. | |
| 2014/0284040 A1 | 8/2014 | Colgan et al. | |
| 2015/0062811 A1* | 3/2015 | Suzuki | H05K 7/209 361/690 |
| 2015/0284834 A1 | 9/2015 | Ellis et al. | |
| 2015/0282381 A1 | 10/2015 | Yampolsky | |
| 2016/0270205 A1 | 9/2016 | Kamimura | |
| 2017/0060177 A1 | 3/2017 | Rahim et al. | |
| 2018/0270943 A1* | 9/2018 | Suzuki | H05K 7/20163 |
| 2018/0270991 A1* | 9/2018 | Suzuki | H05K 5/006 |
| 2019/0037730 A1 | 1/2019 | Gao et al. | |
| 2019/0198480 A1 | 6/2019 | Kim et al. | |
| 2021/0015006 A1* | 1/2021 | Muto | H05K 7/20436 |
| 2021/0059075 A1* | 2/2021 | Mitsui | H05K 7/20145 |

FOREIGN PATENT DOCUMENTS

| | | |
|---|---|---|
| KR | 10-1799732 | 11/2017 |
| KR | 10-1 877322 | 11/2018 |

\* cited by examiner

SOLID STATE DRIVE APPARATUS AND DATA STORAGE APPARATUS INCLUDING THE SAME

CROSS-REFERENCE TO RELATED APPLICATIONS

This application claims the benefit of Korean Patent Application No. 10-2019-0116364, filed on Sep. 20, 2019, and Korean Patent Application No. 10-2019-0175496, filed on Dec. 26, 2019, in the Korean Intellectual Property Office, the disclosures of which are incorporated by reference herein in their entirety.

TECHNICAL FIELD

The present disclosure relates to a solid state drive (SSD), and more particularly, to an SSD apparatus and a data storage apparatus including the SSD.

DISCUSSION OF THE RELATED ART

As electronic products become more highly integrated and more powerful, there is often an increase in heat generated during an operation of the electronic products. To prevent degradation of the characteristics of an electronic product due to heat generation in the electronic product, heat spreaders may be attached to the components that are prone to generate the most heat. Such heat spreaders may include a material having a relatively high thermal conductivity so that heat may be efficiently discharged.

SUMMARY

A solid state drive (SSD) apparatus includes a case including an air tunnel disposed between an inner plate and an upper wall and an accommodation space disposed between the inner plate and a lower wall. The air tunnel extends in a first direction, and both end parts of the air tunnel are exposed to the outside. A substrate is disposed in the accommodation space. At least one semiconductor chip is disposed on the substrate.

A solid state drive (SSD) apparatus includes a case having an accommodation space formed therein. A plurality of heat-dissipating fins is disposed on an outer wall of the case with an air passage communicating with the accommodation space. A substrate is disposed in the accommodation space. At least one semiconductor chip is disposed on the substrate.

A data storage apparatus includes a rack including a socket. A solid state drive (SSD) apparatus is disposed in the rack such that an external connector is connected to the socket. A cooling fan is adjacent to the rack and is configured to drive air flow in a first direction. The SSD apparatus includes a case including an air tunnel disposed between an inner plate and an upper wall and an accommodation space disposed between the inner plate and a lower wall. The air tunnel extends in a first direction, and both end parts of the air tunnel are exposed to the outside. A substrate is disposed in the accommodation space. At least one semiconductor chip is disposed on the substrate.

A solid state drive (SSD) apparatus includes a case having an accommodation space. A substrate is disposed in the accommodation space of the case. At least one semiconductor chip is disposed on the substrate. A heat-dissipating apparatus is disposed on the at least one semiconductor chip. The heat-dissipating apparatus includes a base contacting the at least one semiconductor chip, heat-dissipating fins disposed on the base extending in parallel with each other, and an air passage penetrating the base and the heat-dissipating fins and communicating with the accommodation space of the case.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
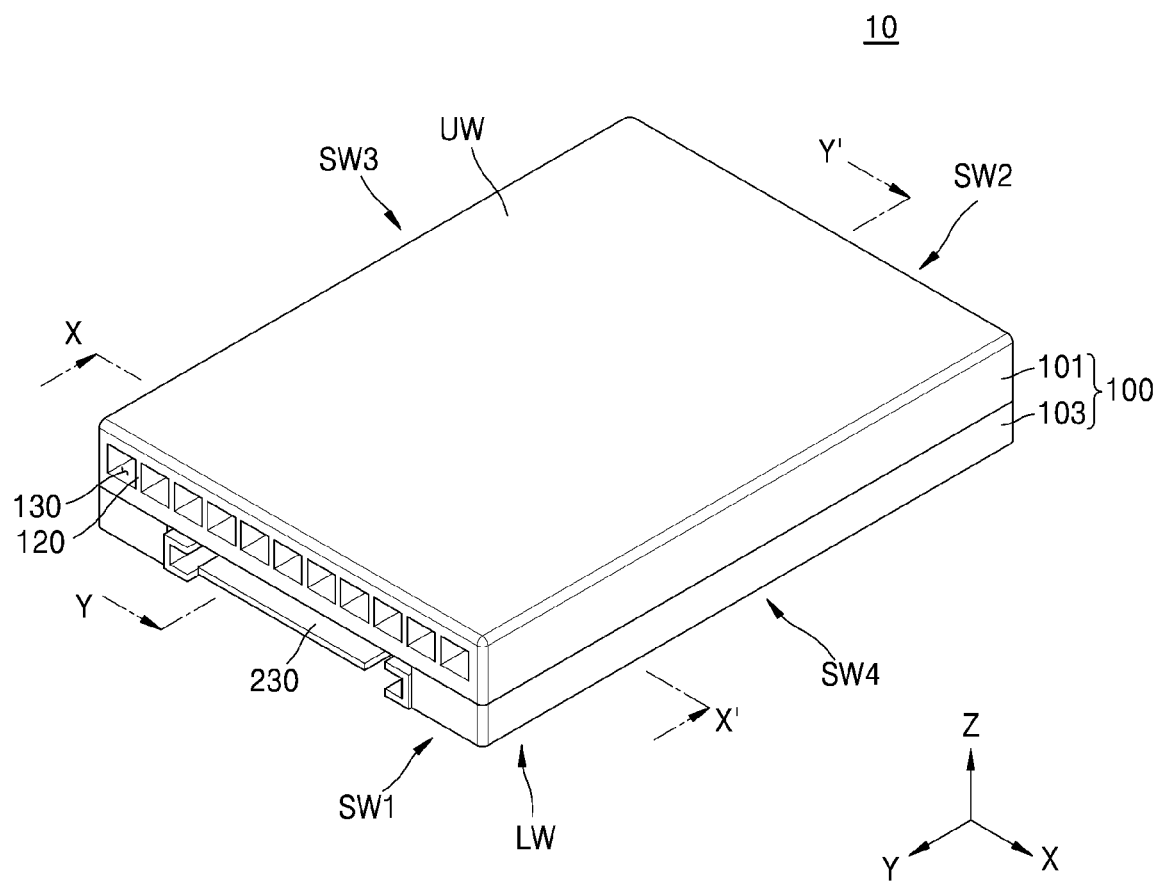
FIG. 1 is a perspective view illustrating a solid state drive (SSD) apparatus according to example embodiments of the inventive concept.

Hereinafter, embodiments of the inventive concept will be described in detail with reference to the accompanying drawings. Like reference numerals in the drawings and specification may denote like elements, and to the extent that a description of these elements has been omitted, it may be assumed that these elements are at least similar to corresponding elements that have been described in detail elsewhere in the present disclosure.

Figure 2:
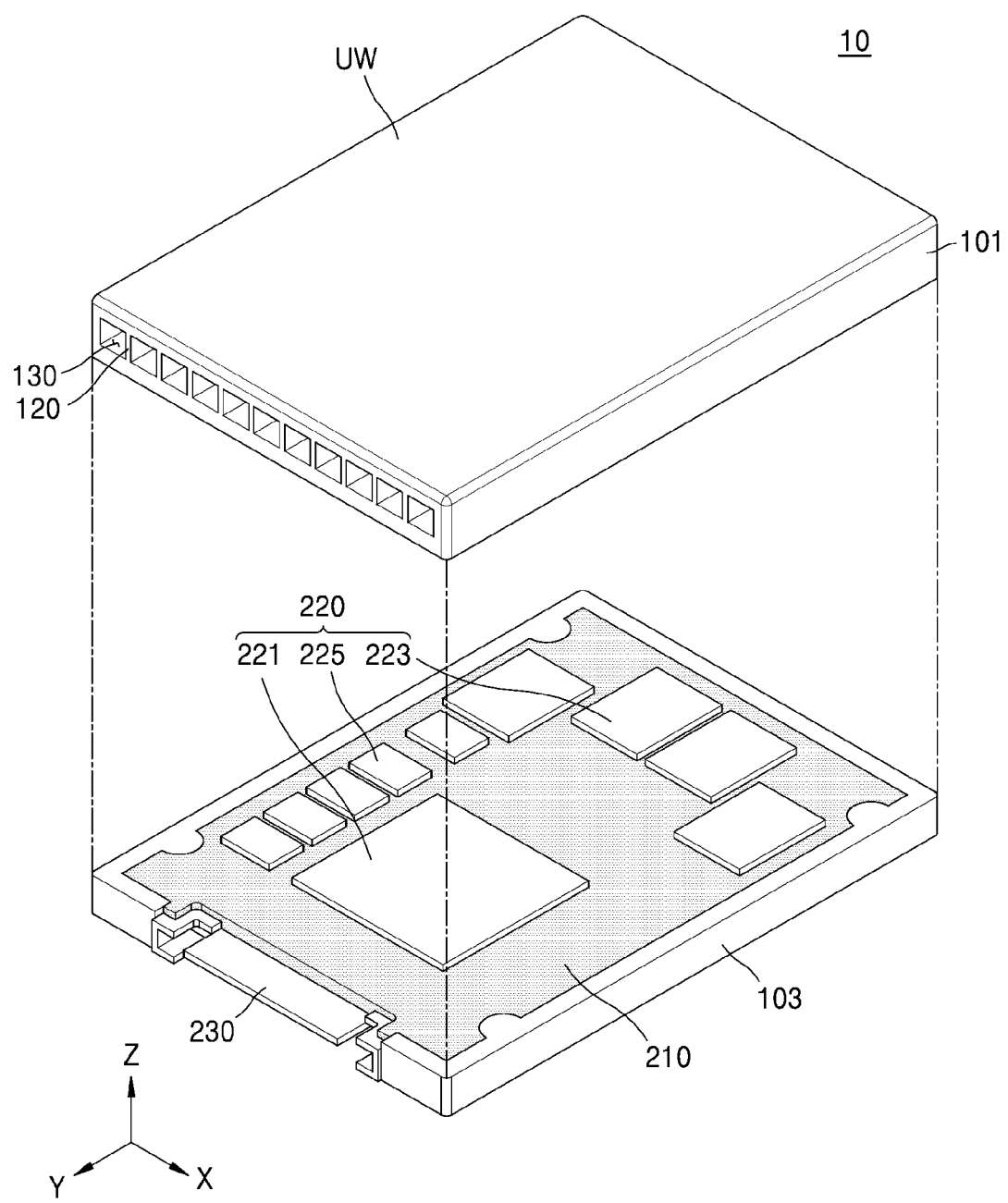
FIG. 2 is an exploded perspective view illustrating the SSD apparatus according to example embodiments of the inventive concept.
Figure 3:
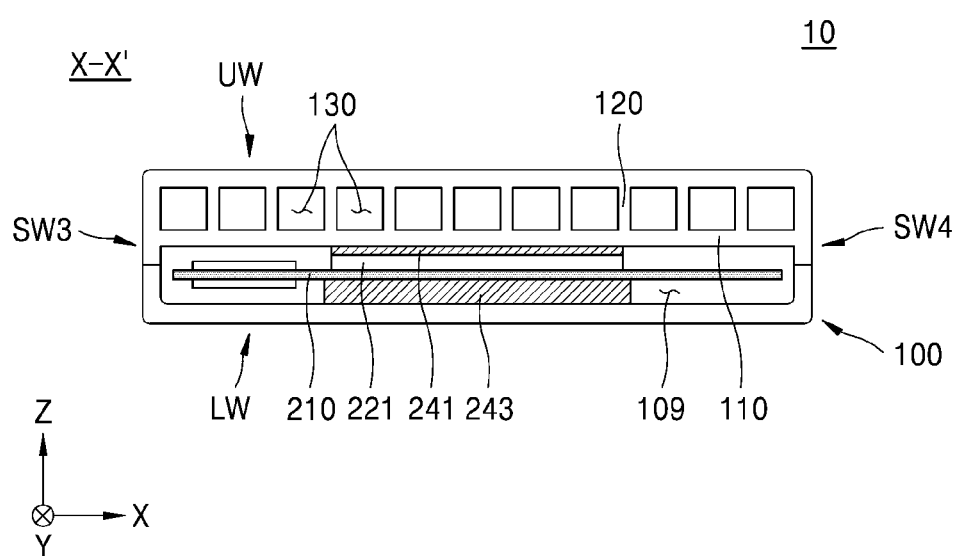
FIG. 3 is a cross-sectional view illustrating the SSD apparatus, taken along line X-X' of FIG. 1.
Figure 4:
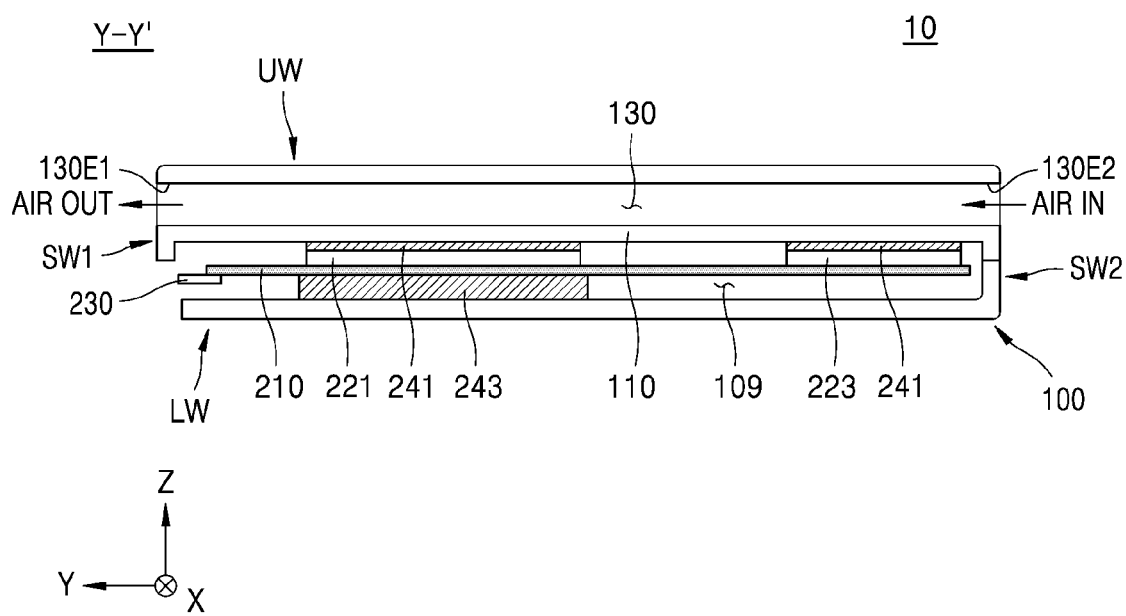
FIG. 4 is a cross-sectional view illustrating the SSD apparatus, taken along line Y-Y' of FIG. 1.

FIG. 1 is a perspective view illustrating a solid state drive (SSD) apparatus 10 according to example embodiments of the inventive concept. FIG. 2 is an exploded perspective view illustrating the SSD apparatus 10 according to example embodiments of the inventive concept. FIG. 3 is a cross-sectional view illustrating the SSD apparatus 10, taken along line X-X' of FIG. 1. FIG. 4 is a cross-sectional view illustrating the SSD apparatus 10, taken along line Y-Y' of FIG. 1.

Referring to FIGS. 1 to 4, the SSD apparatus 10 may include a case 100, a substrate 210 disposed within the case 100, and a semiconductor chip 220 disposed on the substrate 210.

The case 100 may form an exterior of the SSD apparatus 10. The case 100 may have a three-dimensional shape including an accommodation space 109 in which the substrate 210 and the semiconductor chip 220 are accommodable. For example, the case 100 may include an upper wall UW having a plate shape, a lower wall LW having a plate shape and facing the upper wall UW, and side walls connecting the upper wall UW to the lower wall LW. For example, the case 100 may have a square pillar shape having four side walls including a first side wall SW1 and a second side wall SW2 facing each other and a third side wall SW3 and a fourth side wall SW4 facing each other. However, the shape of the case 100 is not limited thereto, and the case 100 may have a polygonal pillar shape such as a pentagonal pillar or a hexagonal pillar, or a cylindrical shape.

The case 100 may include an upper case 101 and a lower case 103, which are detachably coupled. The upper case 101 may be coupled onto the lower case 103 to form the accommodation space 109 therebetween. The upper case 101 may include at least a part of the side walls of the case 100 and an entirety of the upper wall UW of the case 100. The lower case 103 may include at least a part of the side walls of the case 100 and an entirety of the lower wall LW of the case 100.

The case 100 may include a material having a high thermal conductivity (e.g. a thermal conductivity of at least 10 W/m K) so as to more easily discharge heat generated from the semiconductor chip 220 to the outside. As used herein, the phrase "outside" is intended to mean a space outside the case 100. The case 100 may include a single material or a combination of different materials. The case 100 may include a metal, a carbon-based material, a polymer, or a combination thereof. The case 100 may include, for example, copper (Cu), aluminum (Al), zinc (Zn), tin (Sn), stainless steel, or a clad metal including one or more of the same. Alternatively, the case 100 may include, for example, graphite, graphene, a carbon fiber, a carbon nanotube composite, or the like. Alternatively, the case 100 may include, for example, an epoxy resin, polymethylmethacrylate (PMMA), polycarbonate (PC), polyethylene (PE), polypropylene (PP), or the like.

According to example embodiments of the inventive concept, the upper case 101 and the lower case 103 may be produced by extrusion and machining. In this case, each of the upper case 101 and the lower case 103 may be made of a single member without a breakpoint, and thus, a thermal diffusion ability thereof may be increased.

The case 100 may include an inner plate 110 which separates or partitions an inner space of the case 100 into an air tunnel 130 and the accommodation space 109. For example, the inner plate 110 may be a plate-shaped member parallel to the upper wall UW and may be a part of the upper case 101. The air tunnel 130 may be provided between the inner plate 110 and the upper wall UW of the case 100 and may be enclosed within the side walls of the case 100. In addition, the accommodation space 109 may be provided between the inner plate 110 and the lower wall LW of the case 100 and may be enclosed within the side walls of the case 100.

The air tunnel 130 may be a passage formed in the case 100 so as for air to flow therethrough. For example, the air tunnel 130 may be a passage extending primarily in a first direction (e.g., Y direction) from the second side wall SW2 to the first side wall SW1. As used herein, the phrase "extending primarily in a direction" is understood to mean that a longest dimension of the object being referred to extends in the given direction even though it is understood that the object has inferior dimensions that extend in other directions.

For example, when an external cooling fan operates to force air around the SSD apparatus 10 to flow in the first direction, the air may flow in the first direction along the air tunnel 130, such that heat of the SSD apparatus 10 is discharged through heat exchange between the air and the case 100. According to example embodiments of the inventive concept, a second end part 130E2 of the air tunnel 130 exposed through the second side wall SW2 may be an inlet through which external air flows in, and a first end part 130E1 of the air tunnel 130 exposed through the first side wall SW1 may be an outlet through which the external air flows out.

According to example embodiments of the inventive concept, a plurality of air tunnels 130 may be provided between the inner plate 110 and the upper wall UW of the case 100. Each of the plurality of air tunnels 130 may be spaced apart from each other by a plurality of separation walls 120 disposed between the inner plate 110 and the upper wall UW. The plurality of separation walls 120 may be a part of the upper case 101 and may be contiguous therewith.

Each of the plurality of separation walls 120 may extend primarily in the first direction from the second side wall SW2 to the first side wall SW1. In this case, each air tunnel 130 may be defined by two neighboring separation walls 120, the inner plate 110, and the upper wall UW or defined by a side wall of the case 100, a separation wall 120, the inner plate 110, and the upper wall UW. According to example embodiments of the inventive concept, the plurality of separation walls 120 may extend primarily in the first direction so as to be parallel to each other and may be spaced apart from one another at uniform intervals in a second direction (e.g., X direction) orthogonal to the first direction.

The separation walls 120 may help to establish a constant air flow in the first direction inside the air tunnels 130 and suppress generation of a vortex causing a disturbance of heat transfer between air and the case 100. In addition, by providing the separation walls 120 between the inner plate 110 and the upper wall UW of the case 100, a heat exchange area between the case 100 and air flowing along the air tunnels 130 may increase, thereby increasing a heat-dissipating characteristic of the SSD apparatus 10.

The substrate 210 and the semiconductor chip 220 may be arranged in the accommodation space 109 of the case 100. The semiconductor chip 220 may be mounted on the substrate 210 by, for example, a ball grid array (BGA) scheme, a pin grid array (PGA) scheme, a tape carrier package (TCP) scheme, a chip-on-board (COB) scheme, a quad flat non-leaded (QFN) scheme, a quad flat package (QFP) scheme, or the like. For example, the semiconductor chip 220 may be mounted on either an upper surface or a lower surface of the substrate 210. Alternatively, the semiconductor chip 220 may be mounted on both the upper surface and the lower surface of the substrate 210.

According to example embodiments of the inventive concept, the substrate 210 may be a printed circuit board (PCB). For example, the substrate 210 may be a double-sided PCB or a multi-layer PCB. The substrate 210 may include a base layer. The base layer may include a phenol resin, an epoxy resin, and/or polyimide. The base layer may include, for example, frame retardant 4 (FR4), tetrafunctional epoxy, polyphenylene ether, epoxy/polyphenylene oxide, bismaleimide triazine (BT), thermount, cyanate ester, polyimide, and/or a liquid crystal polymer.

The substrate 210 may include a wiring layer formed on both an upper surface and a lower surface of the base layer. When the base layer includes a plurality of layers, wiring layers may be formed between the plurality of layers. The substrate 210 may include a conductive via electrically connecting the wiring layers located on different layers in the base layer. The conductive via may electrically connect the wiring layers located on different layers by partially or completely penetrating the base layer. The wiring layer and/or the conductive via may be made of Al, Cu, nickel (Ni), and/or tungsten (W).

A solder resist layer covering a part of the wiring layers on the upper surface and the lower surface of the base layer may be formed on the upper surface and the lower surface of the substrate 210. A part which is not covered by the solder resist layer among the wiring layers on the upper surface and the lower surface of the base layer may be used as a pad to be electrically connected to the semiconductor chip 220, an active device, or a passive device attached to the upper surface and/or the lower surface of the substrate 210.

The semiconductor chip 220 may include a controller chip 221, a first memory semiconductor chip 223, and a second memory semiconductor chip 225 mounted on the substrate 210.

The controller chip 221 may be configured to control both the first memory semiconductor chip 223 and the second memory semiconductor chip 225. A controller circuit may be equipped within the controller chip 221. The controller circuit may control access to data stored in the first memory semiconductor chip 223 and the second memory semiconductor chip 225. The controller circuit may control a write/read operation for flash memory or the like in response to a control command of an external host. The controller circuit may include a separate control semiconductor chip such as an application specific integrated circuit (ASIC). The controller circuit may be configured to be automatically activated by an operating system of the external host when, for example, the SSD apparatus 10 is connected to the external host. The controller circuit may provide a standard protocol such as parallel advanced technology attachment (PATA), serial advanced technology attachment (SATA), small computer system interface (SCSI) standard, or parallel component interconnect express (PCIe). In addition, the controller circuit may perform wear leveling, garbage collection, bad block management, and/or error correcting code for driving of a nonvolatile memory device. In this case, the controller circuit may include a script for automatic execution and an application program executable by the external host.

The first memory semiconductor chip 223 may be a nonvolatile memory device. The nonvolatile memory device may include, for example, flash memory, phase-change random access memory (PRAM), resistive random access memory (RRAM), ferroelectric random access memory (FeRAM), magnetic random access memory (MRAM), or the like but is not limited thereto. The flash memory may be, for example, NAND flash memory. The flash memory may be, for example, V-NAND flash memory. The nonvolatile memory device may include a single semiconductor die or several stacked semiconductor dies.

The second memory semiconductor chip 225 may be a volatile memory device. The volatile memory device may include, for example, dynamic random access memory (DRAM), static random access memory (SRAM), or the like but is not limited thereto. The volatile memory device may provide a cache function of storing data frequently used when the external host accesses the SSD apparatus 10, such that an access time and a data-transfer performance are scaled to meet the process performance of the external host connected to the SSD apparatus 10.

A resistor, a capacitor, an inductor, a switch, a temperature sensor, a direct current (DC)-DC converter, an active device, and/or a passive device may be further mounted on the substrate 210 of the SSD apparatus 10.

An external connector 230 may be disposed at a first edge of the substrate 210 facing the first side wall SW1. The external connector 230 may be exposed through a groove in the first side wall SW1. The external connector 230 may be inserted into a socket of an external device and may electrically connect the SSD apparatus 10 to the external device. Through the external connector 230, the SSD apparatus 10 may transmit and receive a signal to and from the external device and receive power from the external device.

A thermal interface material may be disposed between the semiconductor chip 220 and the inner plate 110. For example, as shown in FIG. 4, a first thermal interface material 241 may be disposed between the controller chip 221 and the inner plate 110 and additionally disposed between the first memory semiconductor chip 223 and the inner plate 110. The first thermal interface material 241 may also be disposed between the second memory semiconductor chip 225 and the inner plate 110. The first thermal interface material 241 may physically fix the semiconductor chip 220 to the inner plate 110 and reinforce thermal coupling between the semiconductor chip 220 and the inner plate 110. In addition, a second thermal interface material 243 may be disposed between the substrate 210 and the lower wall LW of the case 100. The second thermal interface material 243 may physically fix the substrate 210 to the lower wall LW of the case 100 and reinforce thermal coupling between the substrate 210 and the lower wall LW of the case 100. In addition, when the semiconductor chip 220 is disposed on the lower surface of the substrate 210, a thermal interface material may be disposed between the semiconductor chip 220 on the lower surface of the substrate 210 and the lower wall LW. For example, the first thermal interface material 241 and the second thermal interface material 243 may each include an insulating material or a material capable of maintaining an electrically insulating property by including an insulating material.

Recently, the performance of electronic apparatuses such as a central processing unit (CPU), a memory device, and a storage device has been sharply increasing every year. To maximally use the performance of electronic apparatuses, a system architecture and a communication protocol also require a high-speed operation that supports the enhanced performance, and thus, a PCI communication protocol supports 8 Gbps (Gen3) at present, and a data transfer rate is increasing to 16 Gbps (Gen4) in 2020 and 32 Gbps (Gen5) in 2021. As such, although the performance of electronic apparatuses is increasing according to an increase in an input and output (IO) speed, more heat is generated according to more power consumption on the contrary, and the reliability of the SSD apparatus 10 may be lowered due to this thermal issue.

According to example embodiments of the inventive concept, the case 100 of the SSD apparatus 10 may include the air tunnel 130 in which air flows. Because the case 100 heated by the semiconductor chip 220 and the like may be cooled down while air flows though the air tunnel 130, a heat-dissipating characteristic of the SSD apparatus 10 may be increased, and eventually, the reliability of the SSD apparatus 10 may be increased.

Figure 5:
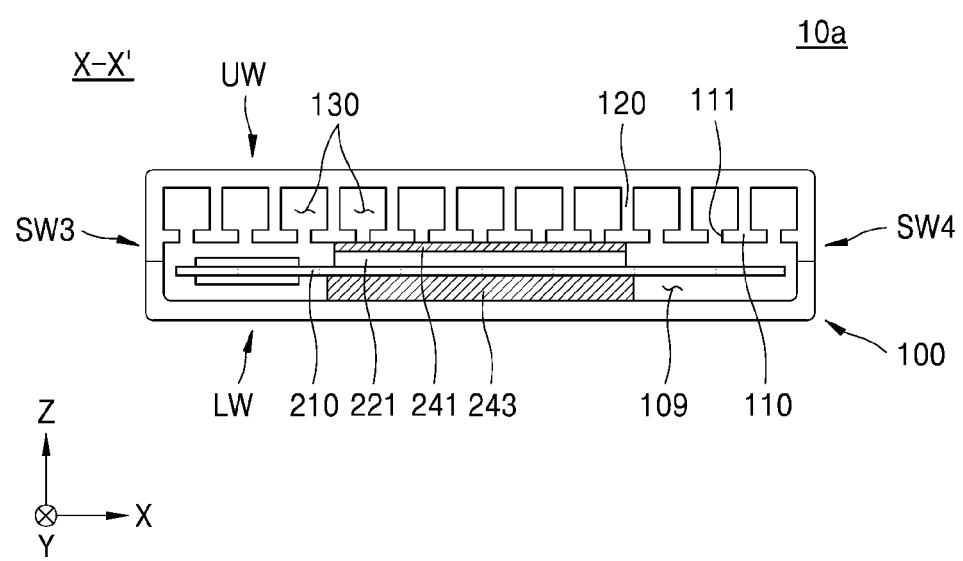
FIGS. 5 and 6 are cross-sectional views illustrating an SSD apparatus according to example embodiments of the inventive concept.
Figure 6:
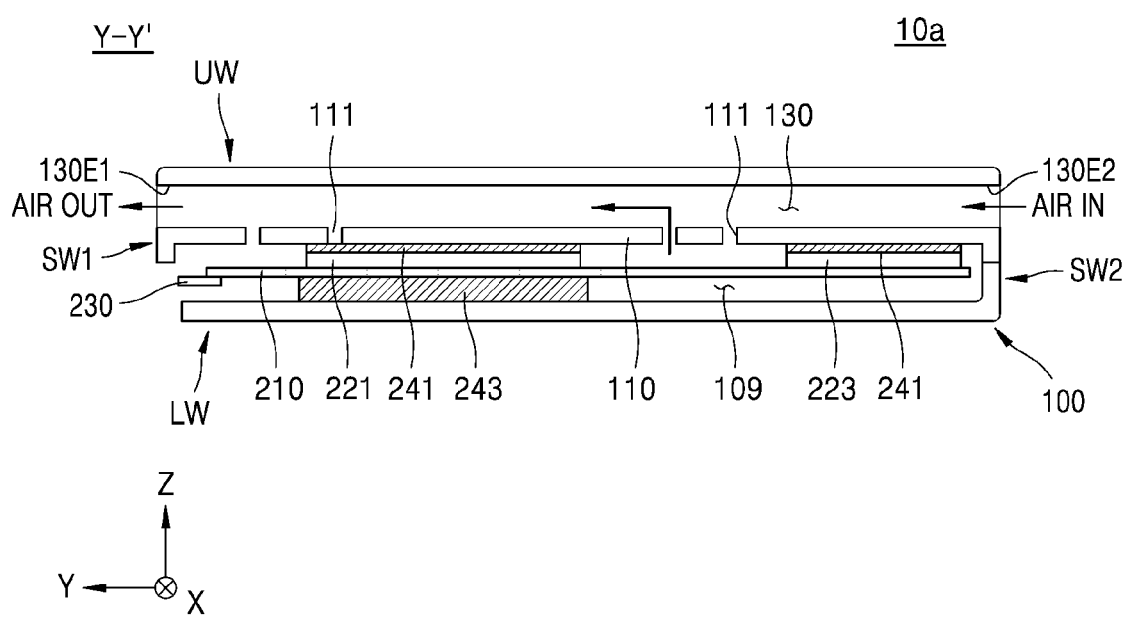
Figure 7:
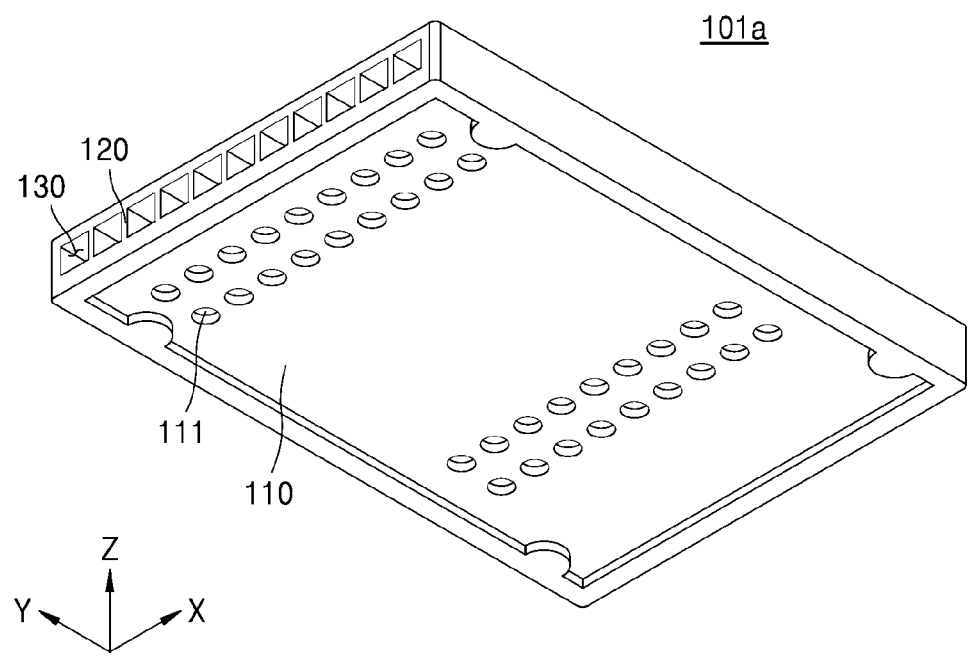
FIG. 7 is a perspective view illustrating an upper case of the SSD apparatus shown in FIGS. 5 and 6.

FIGS. 5 and 6 are cross-sectional views illustrating an SSD apparatus 10a according to example embodiments of the inventive concept. FIG. 7 is a perspective view illustrating an upper case 101a of the SSD apparatus 10a shown in FIGS. 5 and 6.

The SSD apparatus 10a shown in FIGS. 5 to 7 may be substantially the same as or similar to the SSD apparatus 10 described with reference to FIGS. 1 to 4 except that a vent hole 111 is formed in the inner plate 110. For convenience of description, a difference from the SSD apparatus 10 described with reference to FIGS. 1 to 4 will be mainly described and to the extent that description of other elements has been omitted, it may be assumed that these elements are at least similar to corresponding elements that have been described in detail elsewhere in the present disclosure.

Referring to FIGS. 5 to 7, the inner plate 110 may include the vent hole 111 penetrating the inner plate 110. The vent hole 111 of the inner plate 110 may connect the air tunnel 130 with the accommodation space 109. While air flows in the first direction (e.g., the Y direction) in the air tunnel 130, heated air in the accommodation space 109 may flow in the air tunnel 130 through the vent hole 111 and flow out to the first end part 130E1 of the air tunnel 130 together with air which has flowed in through the second end part 130E2 of the air tunnel 130.

Figure 8:
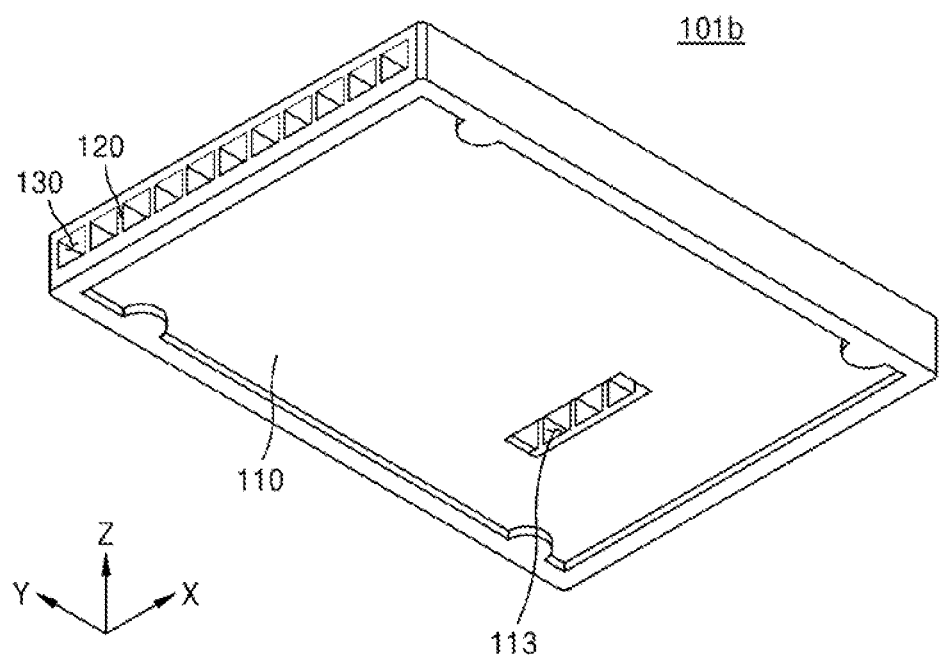
FIG. 8 is a perspective view illustrating an upper case of an SSD apparatus, according to example embodiments of the inventive concept.
Figure 9:
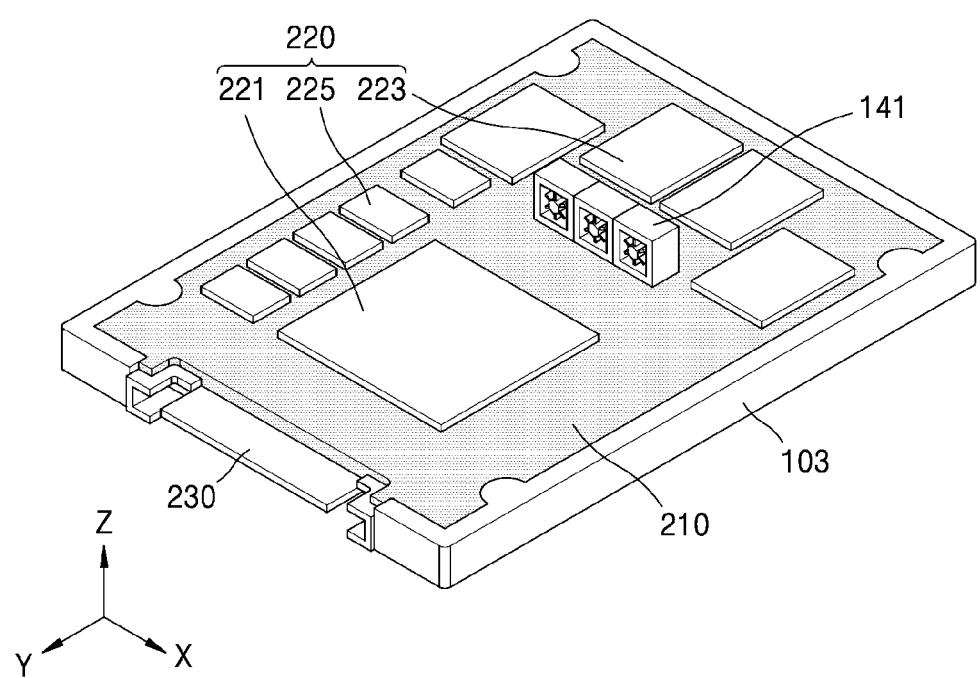
FIG. 9 is a perspective view illustrating an SSD apparatus, from which an upper case is omitted, according to example embodiments of the inventive concept.
Figure 10:
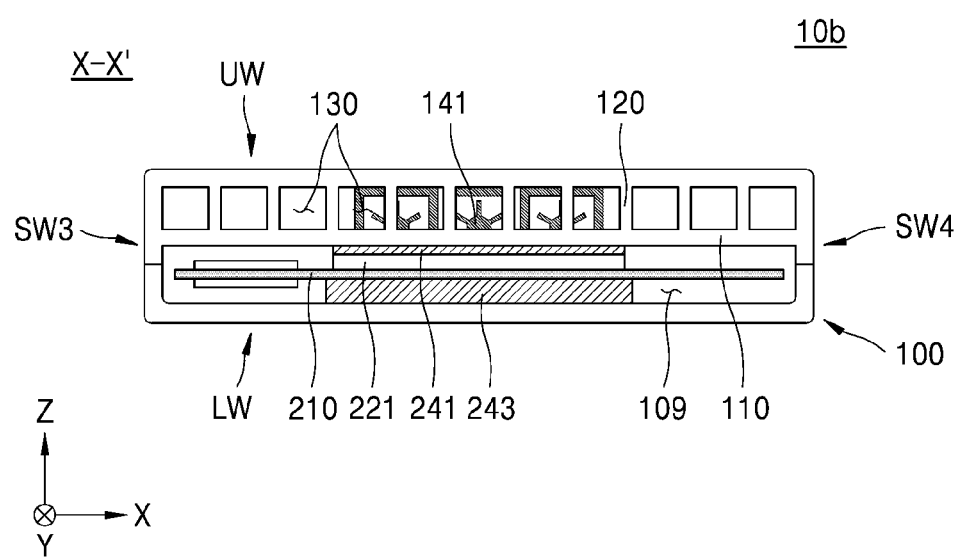
FIGS. 10 and 11 are cross-sectional views illustrating an SSD apparatus according to example embodiments of the inventive concept.
Figure 11:
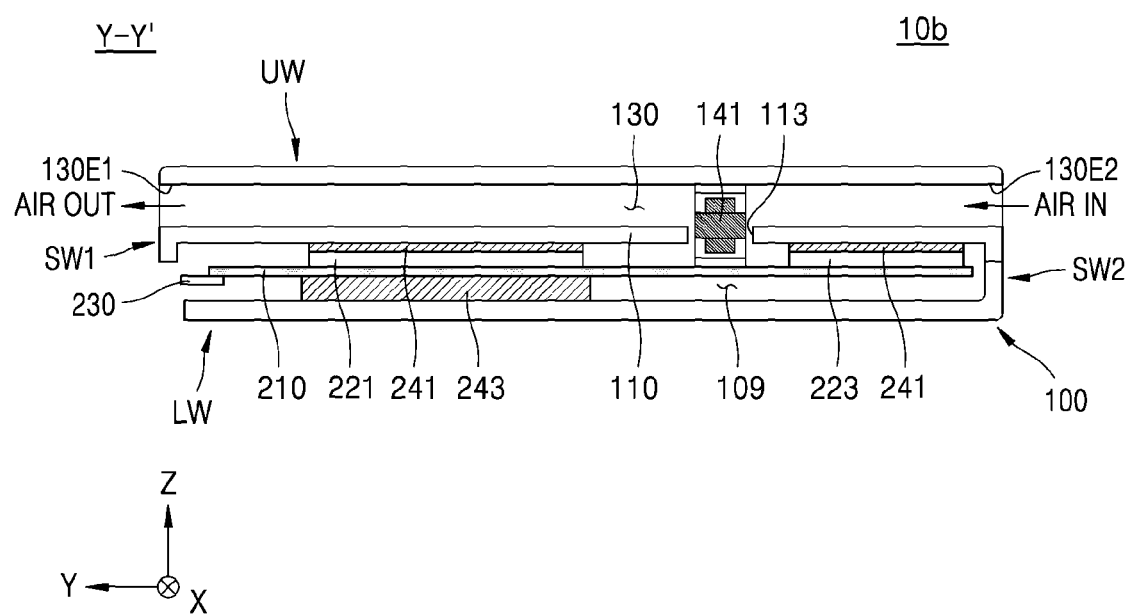

FIG. 8 is a perspective view illustrating an upper case 101b of an SSD apparatus 10b, according to example embodiments of the inventive concept, and FIG. 9 is a perspective view illustrating the SSD apparatus 10b, from which an upper case 101b is omitted, according to example embodiments of the inventive concept. FIGS. 10 and 11 are cross-sectional views illustrating the SSD apparatus 10b according to example embodiments of the inventive concept.

The SSD apparatus 10b shown in FIGS. 8 to 11 may be substantially the same as or similar to the SSD apparatus 10 described with reference to FIGS. 1 to 4 except that the SSD apparatus 10b further includes a first inner fan 141. For convenience of description, a difference from the SSD apparatus 10 described with reference to FIGS. 1 to 4 will be mainly described and to the extent that description of other elements has been omitted, it may be assumed that these elements are at least similar to corresponding elements that have been described in detail elsewhere in the present disclosure.

Referring to FIGS. 8 to 11, the SSD apparatus 10b may include the first inner fan 141 in the case 100. The first inner fan 141 may be attached onto the upper surface of the substrate 210 and accommodated within a first mounting groove 113 of the inner plate 110. At least a part of the first inner fan 141 may be accommodated in the air tunnel 130. The first inner fan 141 may be an air-blowing fan configured to force air in the air tunnel 130 to flow.

According to example embodiments of the inventive concept, the first inner fan 141 may be attached onto the substrate 210 such that the first inner fan 141 blows are in the first direction (e.g., the Y direction). When the first inner fan 141 operates, a flow speed of air flowing in the air tunnel 130 in the first direction increases, and thus, heat transfer efficiency between air flowing along the air tunnel 130 and the case 100 may be increased.

According to example embodiments of the inventive concept, the first inner fan 141 may be disposed in some of the plurality of air tunnels 130. For example, the first inner fan 141 may be disposed exclusively within air tunnels 130 overlapping, in a vertical direction, the controller chip 221, which may generate a relatively large amount of heat. In this case, a flow speed of air flowing in the air tunnels 130 in which the first inner fan 141 is disposed increases, and thus, heat dissipation around the controller chip 221, which generates a relatively large amount of heat, may be reinforced.

Figure 12:
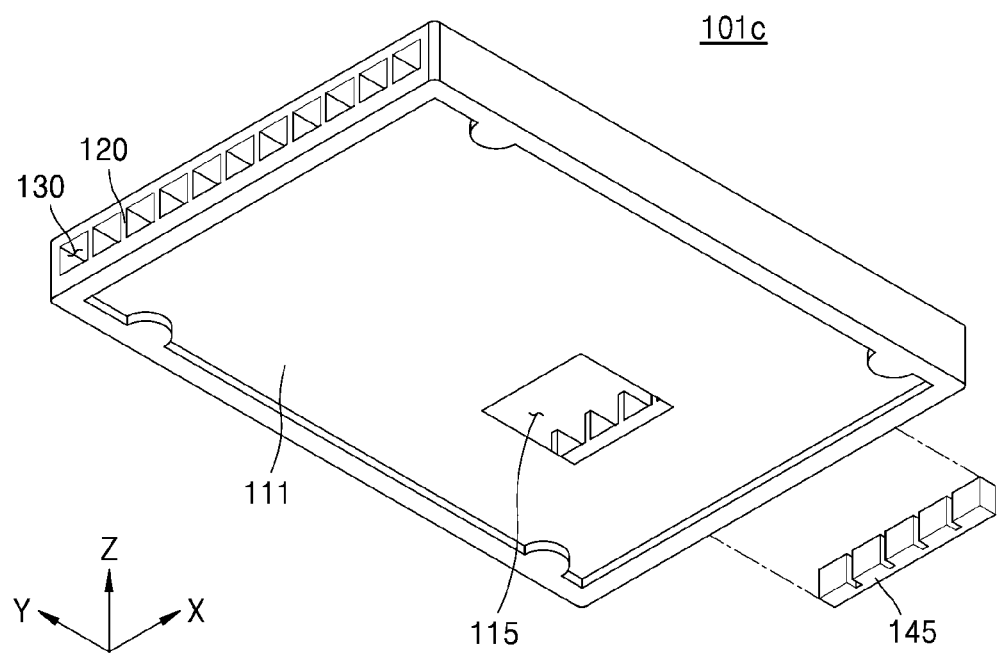
FIG. 12 is a perspective view illustrating an upper case and a cap member of an SSD apparatus, according to example embodiments of the inventive concept.
Figure 13:
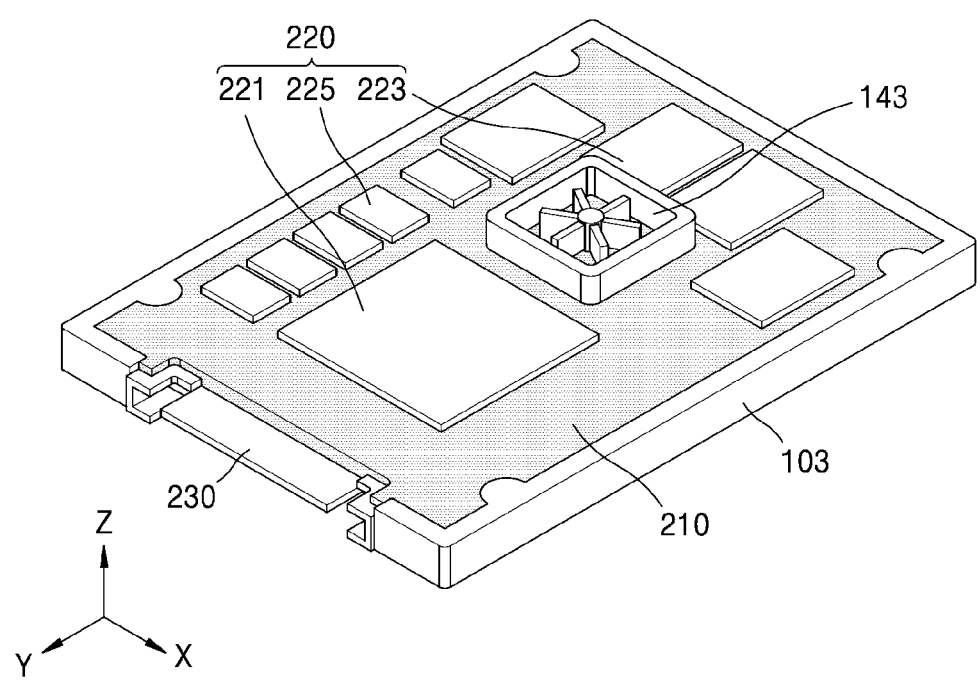
FIG. 13 is a perspective view illustrating an SSD apparatus, from which an upper case and a cap member are omitted, according to example embodiments of the inventive concept.
Figure 14:
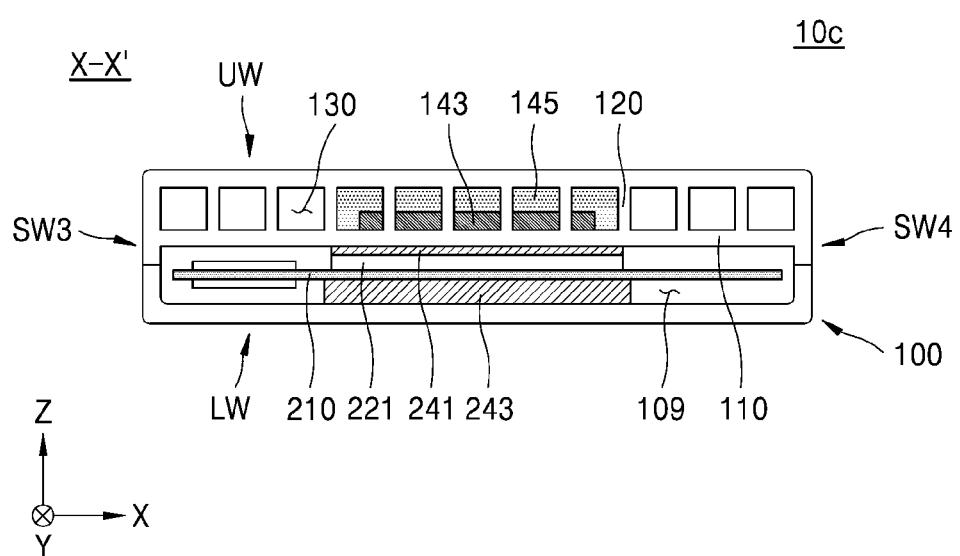
FIGS. 14 and 15 are cross-sectional views illustrating an SSD apparatus according to example embodiments of the inventive concept.
Figure 15:
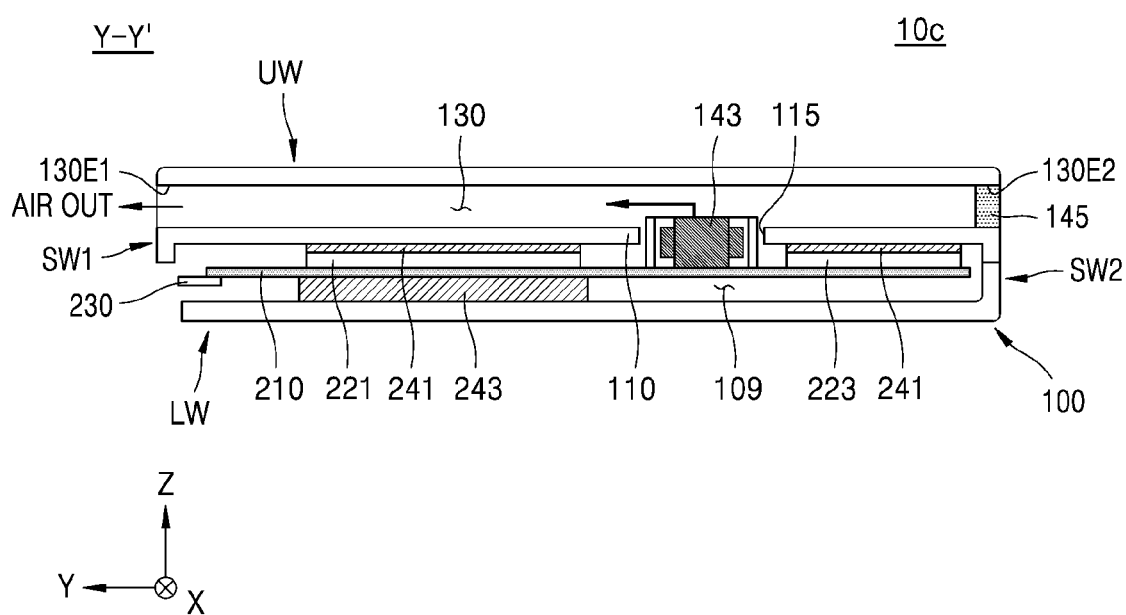

FIG. 12 is a perspective view illustrating an upper case 101c and a cap member 145 of an SSD apparatus 10c, according to example embodiments of the inventive concept, and FIG. 13 is a perspective view illustrating the SSD apparatus 10c, from which the upper case 101c and the cap member 145 are omitted, according to example embodiments of the inventive concept. FIGS. 14 and 15 are cross-sectional views illustrating the SSD apparatus 10c according to example embodiments of the inventive concept.

The SSD apparatus 10c shown in FIGS. 12 to 15 may be substantially the same as or similar to the SSD apparatus 10 described with reference to FIGS. 1 to 4 except that the SSD apparatus 10c further includes a second inner fan 143 and the cap member 145. For convenience of description, a difference from the SSD apparatus 10 described with reference to FIGS. 1 to 4 will be mainly described and to the extent that description of other elements has been omitted, it may be assumed that these elements are at least similar to corresponding elements that have been described in detail elsewhere in the present disclosure.

Referring to FIGS. 12 to 15, the SSD apparatus 10c may include the second inner fan 143 in the case 100. The second inner fan 143 may be attached onto the upper surface of the substrate 210 and accommodated in a second mounting groove 115 of the inner plate 110. At least a part of the second inner fan 143 may be accommodated in the air tunnel 130. The second inner fan 143 may be an air-blowing fan configured to force air in the air tunnel 130 to flow.

According to example embodiments of the inventive concept, the second inner fan 143 may force air to flow in a direction orthogonal to an extension direction of the air tunnel 130. That is, the second inner fan 143 may be attached onto the substrate 210 such that an air-blowing direction of the second inner fan 143 is substantially parallel to a direction (e.g., Z direction) orienting from the lower wall LW of the case 100 to the upper wall UW. When the second inner fan 143 operates, a flow speed of air flowing in the air tunnel 130 increases, and thus, heat transfer efficiency between air flowing along the air tunnel 130 and the case 100 may be increased. In addition, when the second inner fan 143 is attached onto the substrate 210 such that an air-blowing direction of the second inner fan 143 is oriented in the vertical direction, a larger air-blowing fan may be disposed on the substrate 210, and thus, the heat-dissipating efficiency of the second inner fan 143 may increase.

According to example embodiments of the inventive concept, the second inner fan 143 may be disposed in some of the plurality of air tunnels 130. For example, the second inner fan 143 may be disposed exclusively within air tunnels 130 overlapping, in the vertical direction, the controller chip 221, which generates a relatively large amount of heat. In this case, a flow speed of air flowing in the air tunnels 130 in which the second inner fan 143 is disposed increases, and thus, heat dissipation around the controller chip 221, which generates a relatively large amount of heat, may be reinforced. In this case, the second end parts 130E2 of the air tunnels 130 in which the second inner fan 143 is disposed may be blocked by the cap member 145. Because the second end parts 130E2 of the air tunnels 130 are blocked by the cap member 145, most of the air blown by the second inner fan 143 flows toward the first end parts 130E1 of the air tunnels 130.

Figure 16:
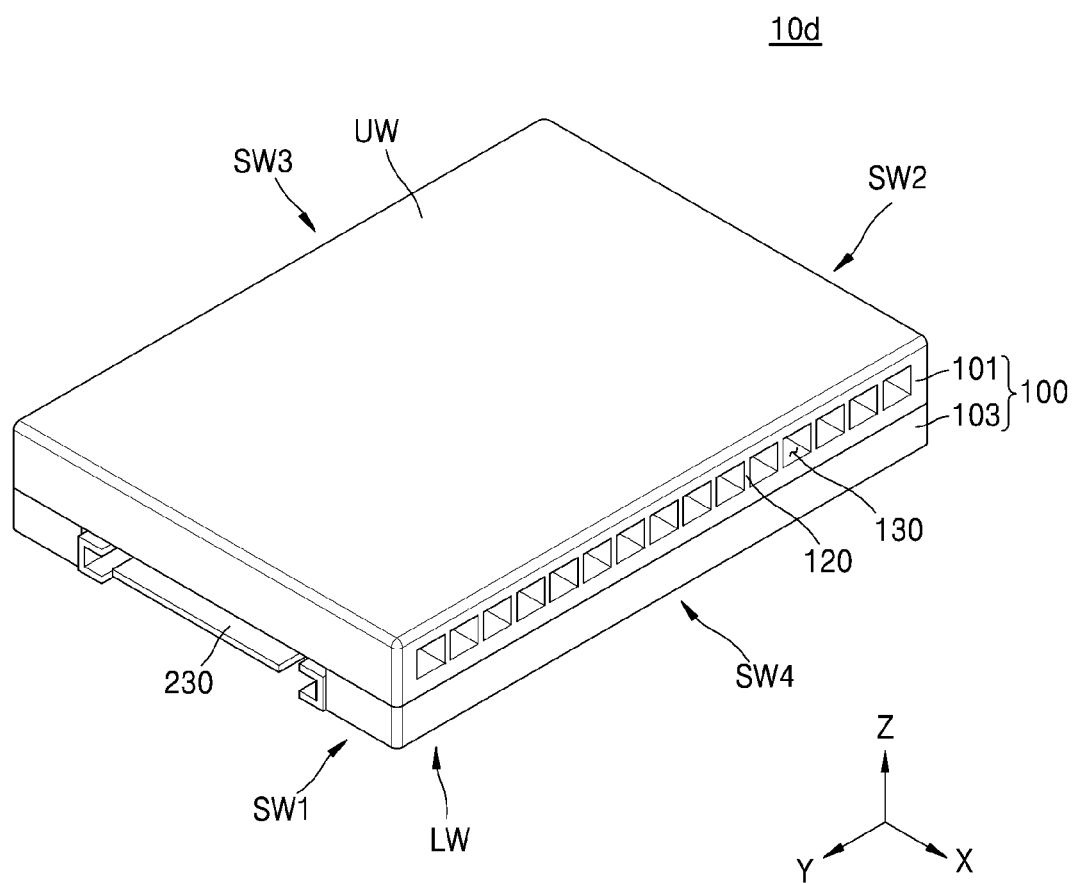
FIG. 16 is a perspective view illustrating an SSD apparatus according to example embodiments of the inventive concept.

FIG. 16 is a perspective view illustrating an SSD apparatus 10d according to example embodiments of the inventive concept.

The SSD apparatus 10d shown in FIG. 16 may be substantially the same as or similar to the SSD apparatus 10 described with reference to FIGS. 1 to 4 except for an extending direction of the air tunnel 130. For convenience of description, a difference from the SSD apparatus 10 described with reference to FIGS. 1 to 4 will be mainly described and to the extent that description of other elements has been omitted, it may be assumed that these elements are at least similar to corresponding elements that have been described in detail elsewhere in the present disclosure.

Referring to FIG. 16, the air tunnel 130 formed in the case 100 may extend primarily in the second direction (e.g., the X direction) from the third side wall SW3 of the case 100 to the fourth side wall SW4 of the case 100. A plurality of separation walls 120 extending in the second direction may be provided between the inner plate 110 and the upper wall UW of the case 100. By the plurality of separation walls 120, a plurality of air tunnels 130 separated from each other may be formed between the inner plate 110 and the upper wall UW of the case 100.

For example, when an external cooling fan operates to force air around the SSD apparatus 10d to flow, the air flows in the second direction along the air tunnels 130 and heat of the SSD apparatus 10d may be discharged through heat exchange between the air and the case 100. In this case, one end part of the air tunnel 130 exposed through the third side wall SW3 may be an inlet through which external air flows in, and the other end part of the air tunnel 130 exposed through the fourth side wall SW4 may be an outlet through which the external air flows out.

Figure 17A:
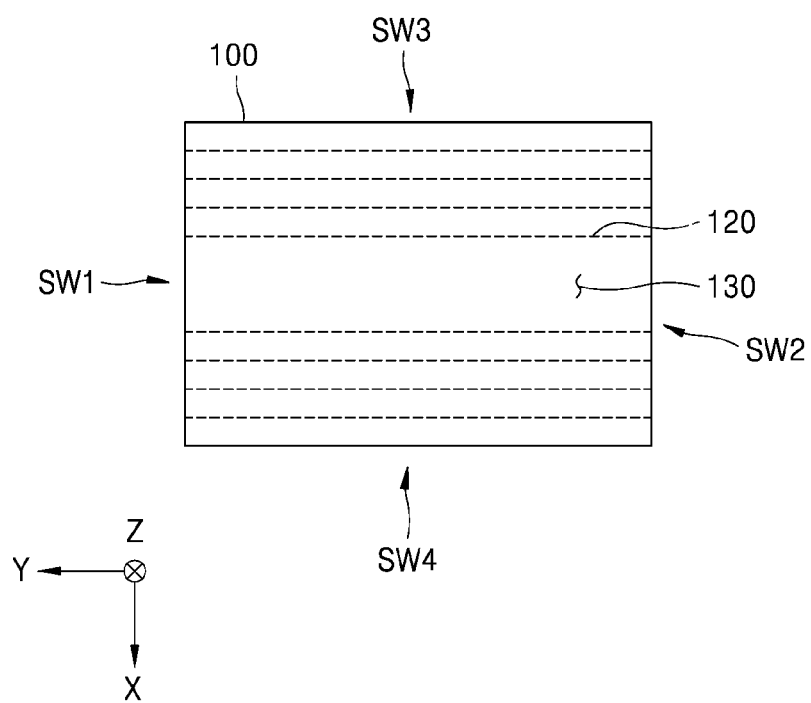
FIGS. 17A and 17B are top views illustrating air tunnels formed in a case, according to example embodiments of the inventive concept.
Figure 17B:
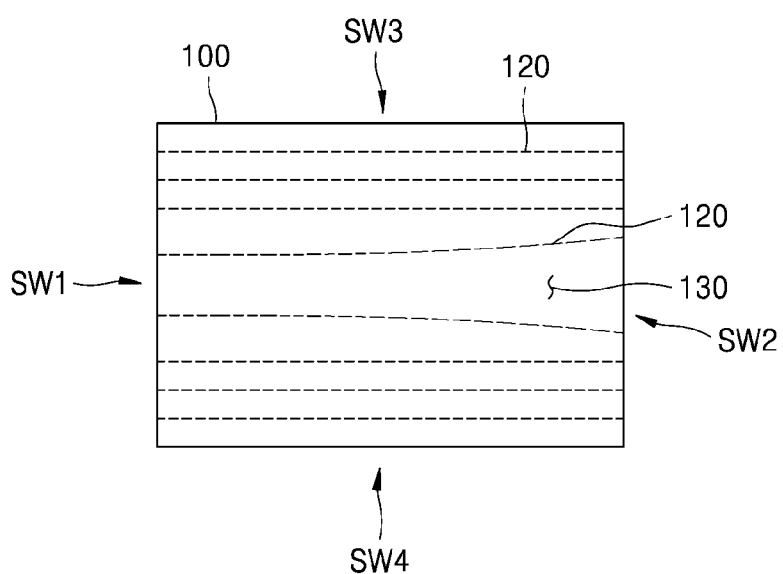

FIGS. 17A and 17B are each a top view illustrating the air tunnel 130 formed in the case 100, according to example embodiments of the inventive concept.

Referring to FIG. 17A, at least one of the plurality of air tunnels 130 may have a width that is different from those of the other air tunnels 130. For example, a width of one air tunnel 130 in the middle of the plurality of air tunnels 130 may be greater than widths of the other air tunnels 130.

Referring to FIG. 17B, an air tunnel 130 may be configured to have a width varying in the extending direction thereof. For example, at least one of the plurality of air tunnels 130 may have a shape in which a width of the at least one air tunnel 130 gradually narrows from the second side wall SW2 to the first side wall SW1. A section at which the width of the air tunnel 130 narrows may overlap, in the vertical direction, the controller chip 221, which generates a relatively large amount of heat. In this case, because a flow speed of air may increase in the section at which the width of the air tunnel 130 narrows, heat dissipation around the controller chip 221, which generates a relatively large amount of heat, may be reinforced.

Figure 18:
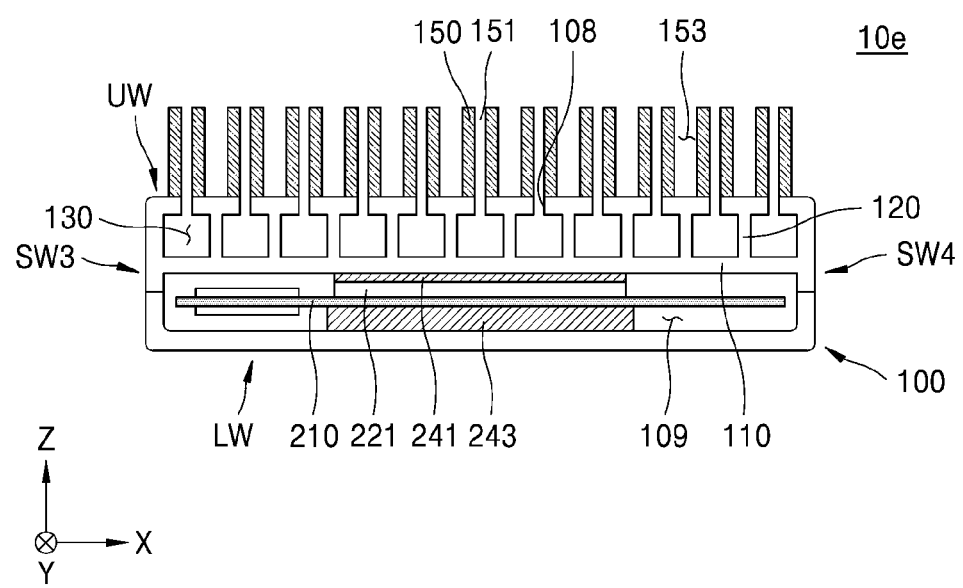
FIGS. 18 and 19 are cross-sectional views illustrating an SSD apparatus according to example embodiments of the inventive concept.
Figure 19:
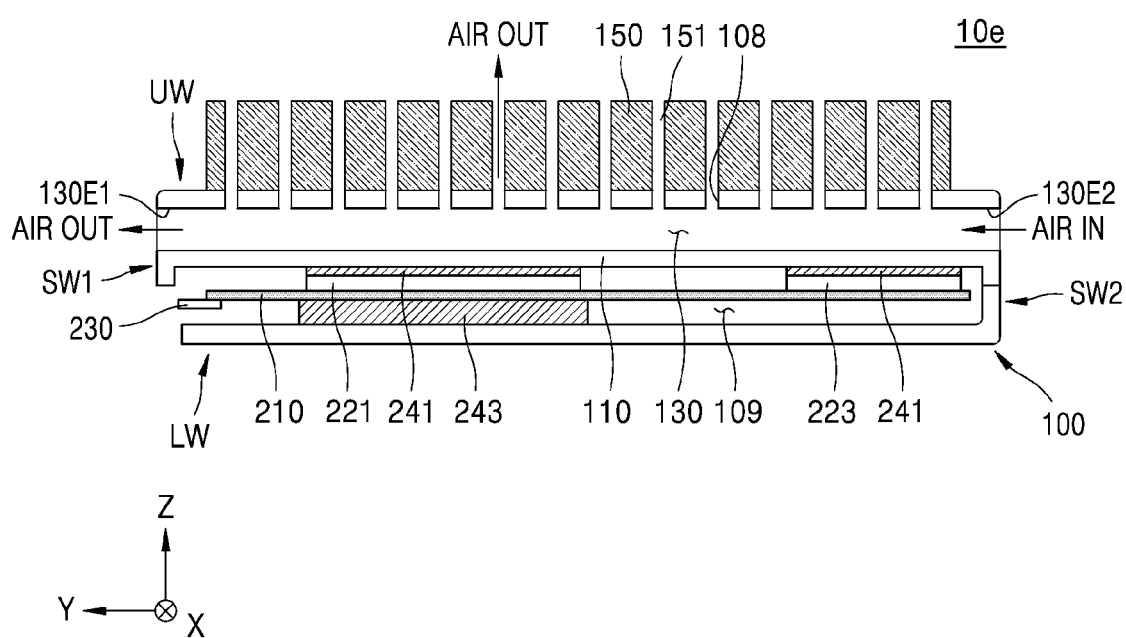
Figure 20:
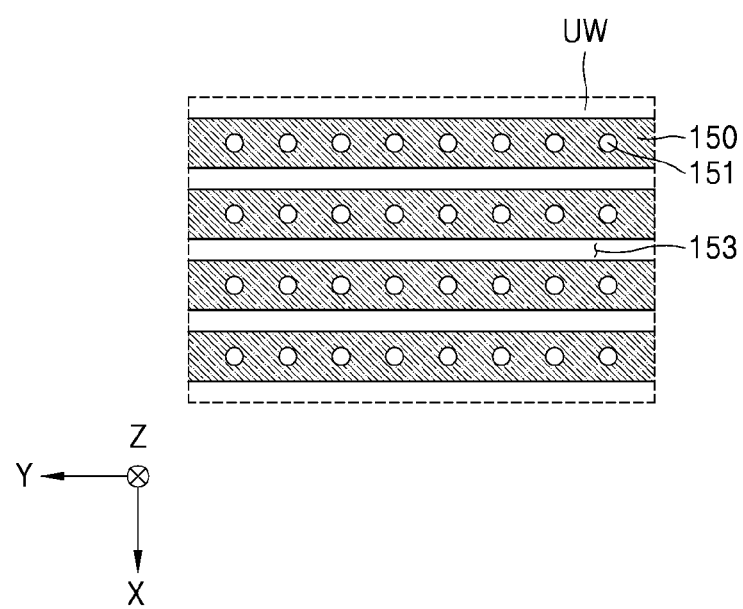
FIG. 20 is a top view illustrating a part of the SSD apparatus shown in FIGS. 18 and 19.

FIGS. 18 and 19 are cross-sectional views illustrating an SSD apparatus 10e according to example embodiments of the inventive concept. FIG. 20 is a top view illustrating a part of the SSD apparatus 10e shown in FIGS. 18 and 19.

The SSD apparatus 10e shown in FIGS. 18 and 19 may be substantially the same as or similar to the SSD apparatus 10 described with reference to FIGS. 1 to 4 except that the SSD apparatus 10e further includes a heat-dissipating fin 150. For convenience of description, a difference from the SSD apparatus 10 described with reference to FIGS. 1 to 4 will be mainly described and to the extent that description of other elements has been omitted, it may be assumed that these elements are at least similar to corresponding elements that have been described in detail elsewhere in the present disclosure.

Referring to FIGS. 18 to 20, the case 100 may include a plurality of heat-dissipating fins 150 on the upper wall UW of the case 100. When the case 100 includes the plurality of heat-dissipating fins 150, a heat transfer area between external air and the case 100 may increase and heat transfer between the external air and the case 100 may be increased.

The heat-dissipating fin 150 may include an air passage 151 vertically penetrating the heat-dissipating fin 150. The air passage 151 of the heat-dissipating fin 150 may communicate with an inner space of the case 100, and an upper end of the air passage 151 may be exposed to the outside. The air passage 151 of the heat-dissipating fin 150 may function as a chimney through which hot air inside the case 100 is discharged to the outside.

According to example embodiments of the inventive concept, the air passage 151 of the heat-dissipating fin 150 may communicate with the air tunnel 130 inside the case 100 through a through hole 108 formed in the upper wall UW of the case 100. In this case, a part of air which has flowed in through the second end part 130E2 of the air tunnel 130 may be discharged to the outside along the air passage 151 of the heat-dissipating fin 150, and heat of the case 100 may be discharged while air flows through the air passage 151.

According to example embodiments of the inventive concept, the heat-dissipating fin 150 may extend primarily in the first direction (e.g., the Y direction) on the upper wall UW of the case 100. In a top view, the heat-dissipating fin 150 may have a line shape extending in the first direction from a point adjacent to the second side wall SW2 of the case 100 to a point adjacent to the first side wall SW1 of the case 100. One heat-dissipating fin 150 may have a plurality of air passages 151 that are spaced apart from each other in the first direction.

The plurality of air passages 151 may be spaced apart from each other at constant intervals. A groove 153 extending in the first direction may be formed between neighboring heat-dissipating fins 150. By the groove 153, a constant air flow may be formed at the outside of the case 100. Heat of the heat-dissipating fins 150 may be discharged to the outside while external air flows through the groove 153.

Figure 21:
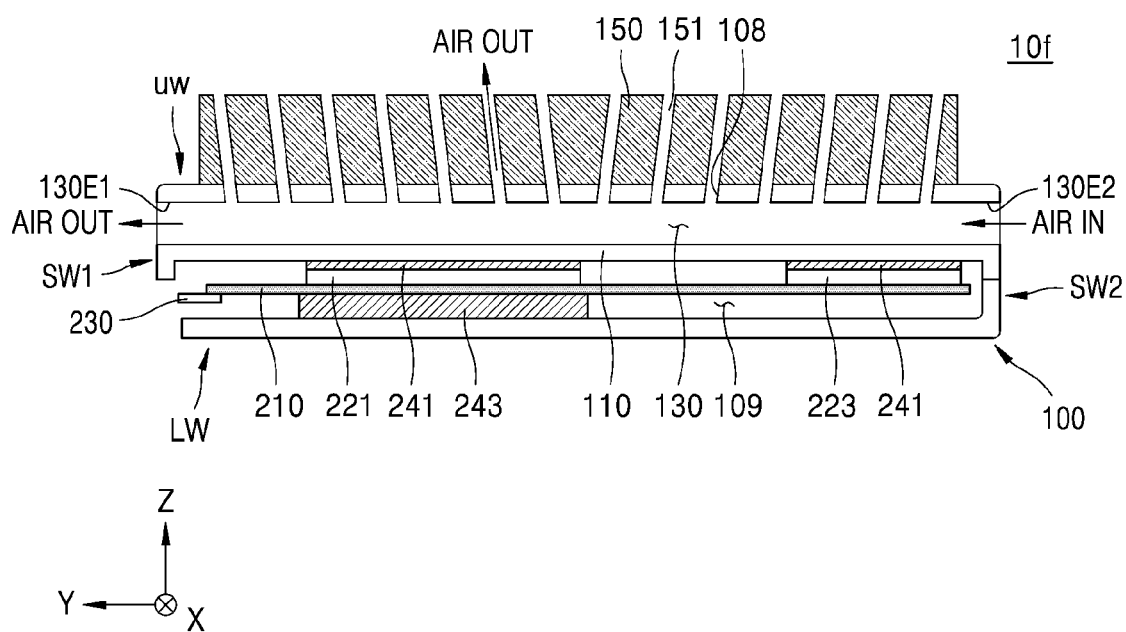
FIG. 21 is a cross-sectional view illustrating an SSD apparatus according to example embodiments of the inventive concept.

FIG. 21 is a cross-sectional view illustrating an SSD apparatus 10f according to example embodiments of the inventive concept.

The SSD apparatus 10f shown in FIG. 21 may be substantially the same as or similar to the SSD apparatus 10e described with reference to FIGS. 18 to 20 except for an extending direction of the air passage 151. For convenience of description, a difference from the SSD apparatus 10e described with reference to FIGS. 18 to 20 will be mainly described and to the extent that description of other elements has been omitted, it may be assumed that these elements are at least similar to corresponding elements that have been described in detail elsewhere in the present disclosure.

Referring to FIG. 21, the air passage 151 of the heat-dissipating fin 150 may extend primarily in an inclined direction with respect to a third direction (e.g., the Z direction) orthogonal to the upper wall UW of the case 100. For example, an angle between the extending direction of the air passage 151 and the third direction may be approximately 5° to approximately 30°. When the air passage 151 of the heat-dissipating fin 150 extends in an incline, inflow of external foreign substances to the inside of the case 100 through the air passage 151 may be suppressed.

Figure 22:
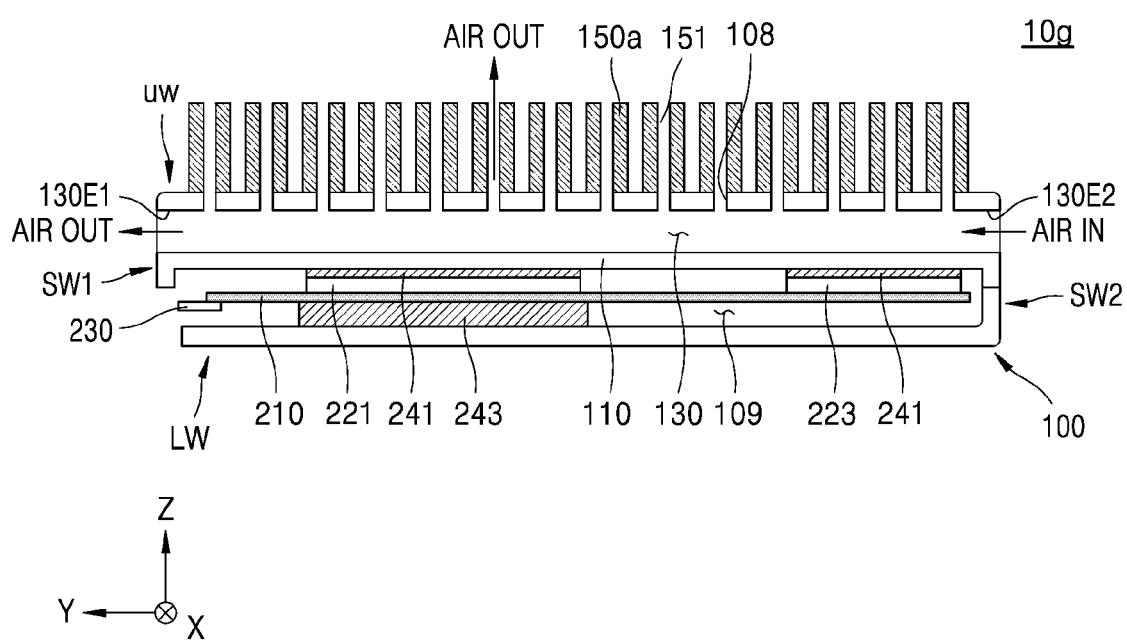
FIG. 22 is a cross-sectional view illustrating an SSD apparatus according to example embodiments of the inventive concept.
Figure 23:
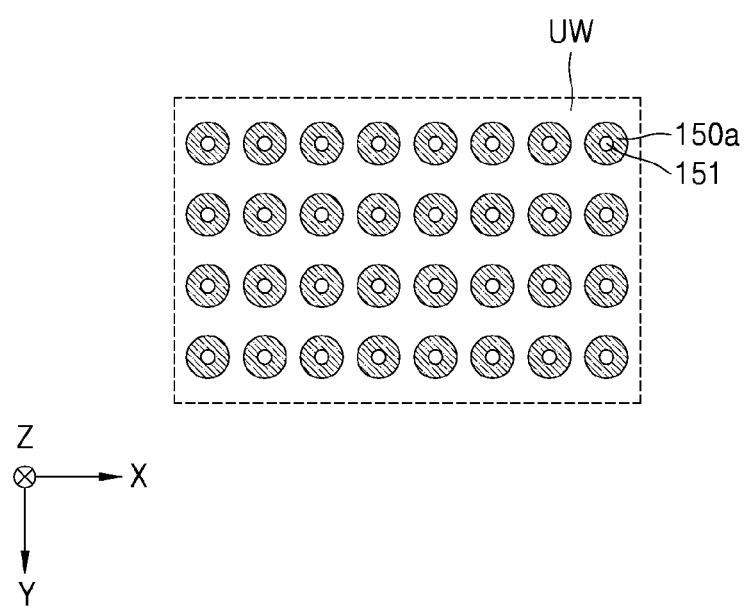
FIG. 23 is a top view illustrating a part of the SSD apparatus shown in FIG. 22.

FIG. 22 is a cross-sectional view illustrating an SSD apparatus 10g according to example embodiments of the inventive concept. FIG. 23 is a top view illustrating a part of the SSD apparatus 10g shown in FIG. 22.

The SSD apparatus 10g shown in FIGS. 22 and 23 may be substantially the same as or similar to the SSD apparatus 10e described with reference to FIGS. 18 to 20 except for a structure of a heat-dissipating fin 150a. For convenience of description, a difference from the SSD apparatus 10e described with reference to FIGS. 18 to 20 will be mainly described and to the extent that description of other elements has been omitted, it may be assumed that these elements are at least similar to corresponding elements that have been described in detail elsewhere in the present disclosure.

Referring to FIGS. 22 and 23, the heat-dissipating fin 150a may have a shape of a pillar standing on the upper wall UW of the case 100. As shown in FIG. 23, the heat-dissipating fin 150a may have a cylindrical shape of which a horizontal cross-section is circular. However, the shape of the heat-dissipating fin 150a is not limited thereto, and the horizontal cross-section of the heat-dissipating fin 150a may have a polygonal shape such as a triangular shape, a quadrangular shape, a pentagonal shape, or a hexagonal shape. One heat-dissipating fin 150a may have one air passage 151 penetrating the heat-dissipating fin 150a. A plurality of heat-dissipating fins 150a may be arranged in two or more rows and two or more columns on the upper wall UW of the case 100.

Figure 24:
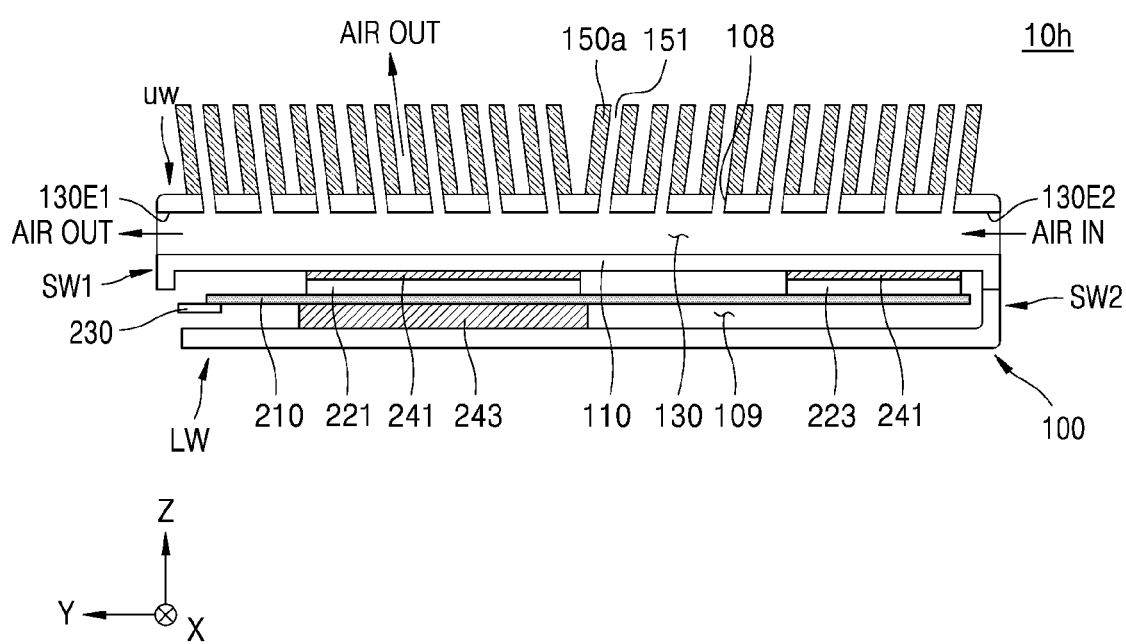
FIG. 24 is a cross-sectional view illustrating an SSD apparatus according to example embodiments of the inventive concept.

FIG. 24 is a cross-sectional view illustrating an SSD apparatus 10h according to example embodiments of the inventive concept.

The SSD apparatus 10h shown in FIG. 24 may be substantially the same as or similar to the SSD apparatus 10g described with reference to FIGS. 22 and 23 except for an extending direction of the heat-dissipating fin 150a. For convenience of description, a difference from the SSD apparatus 10g described with reference to FIGS. 22 and 23 will be mainly described and to the extent that description of other elements has been omitted, it may be assumed that these elements are at least similar to corresponding elements that have been described in detail elsewhere in the present disclosure.

Referring to FIG. 24, the heat-dissipating fin 150a may extend primarily in an inclined direction with respect to the third direction (e.g., the Z direction) orthogonal to the upper wall UW of the case 100. The air passage 151 of the heat-dissipating fin 150a may also extend primarily in the inclined direction with respect to the third direction along the extending direction of the heat-dissipating fin 150a. An angle between the extending direction of the heat-dissipating fin 150a and the third direction may be approximately 5° to approximately 30°. When the heat-dissipating fin 150a and the air passage 151 are inclined, inflow of external foreign substances to the inside of the case 100 through the air passage 151 may be suppressed.

As shown in FIG. 24, an upper surface of the heat-dissipating fin 150a may have a flat shape and be parallel to the upper wall UW. According to other example embodiments of the inventive concept, unlike that shown in FIG. 24, the heat-dissipating fin 150a may have an upper surface of a non-flat shape. For example, the upper surface of the heat-dissipating fin 150a might not be parallel to the upper wall UW. The upper surface of the heat-dissipating fin 150a may be inclined. When the upper surface of the heat-dissipating fin 150a is inclined, inflow of external foreign substances to the inside of the case 100 through the air passage 151 may be suppressed.

Figure 25:
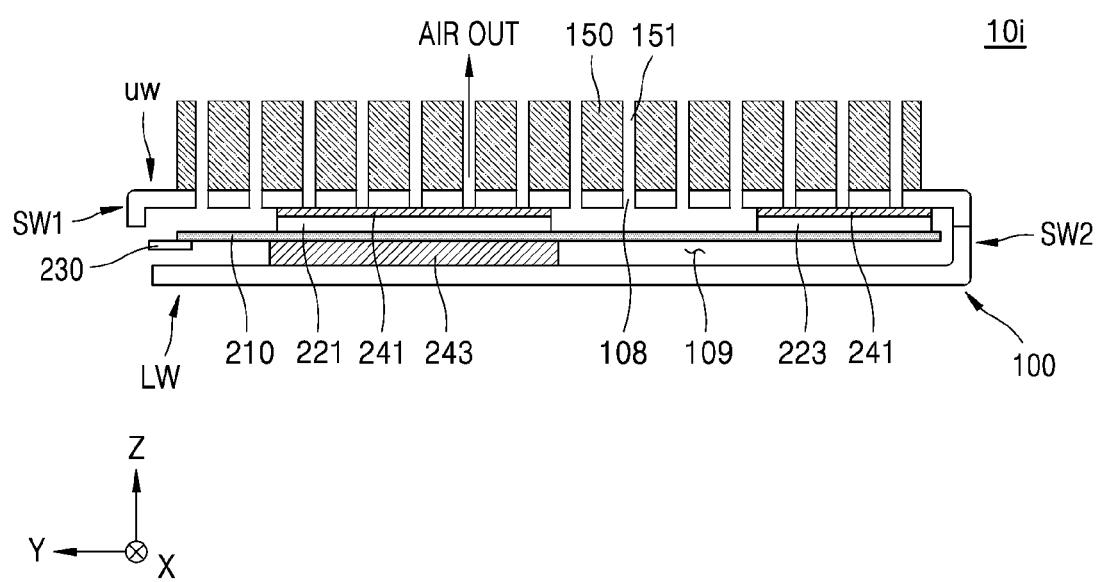
FIG. 25 is a cross-sectional view illustrating an SSD apparatus according to example embodiments of the inventive concept.

In addition, FIG. 25 is a cross-sectional view illustrating an SSD apparatus 10i according to example embodiments of the inventive concept.

The SSD apparatus 10*i* shown in FIG. 25 may be substantially the same as or similar to the SSD apparatus 10*e* described with reference to FIGS. 18 to 20, from which the inner plate 110 and the air tunnels 130 are omitted. For convenience of description, a difference from the SSD apparatus 10*e* described with reference to FIGS. 18 to 20 will be mainly described and to the extent that description of other elements has been omitted, it may be assumed that these elements are at least similar to corresponding elements that have been described in detail elsewhere in the present disclosure.

Referring to FIG. 25, a semiconductor chip (220 of FIG. 2) mounted on the substrate 210, e.g., the controller chip 221 and the first memory semiconductor chip 223, may come in contact with the upper wall UW. The first thermal interface material 241 may be disposed between the controller chip 221 and the upper wall UW and the first memory semiconductor chip 223 and the upper wall UW.

The plurality of heat-dissipating fins 150 may be disposed on an outer wall of the case 100. The air passage 151 of the heat-dissipating fin 150 may communicate with the accommodation space 109 in the case 100 in which the substrate 210 and the like are accommodated and may be exposed to the outside. The air passage 151 may communicate with the accommodation space 109 in the case 100 through the through hole 108 formed in the upper wall UW. Hot air in the case 100 heated by the semiconductor chip (220 of FIG. 2) and the like may be discharged to the outside of the case 100 through the through hole 108 of the upper wall UW and the air passage 151 of the heat-dissipating fin 150.

Figure 26:
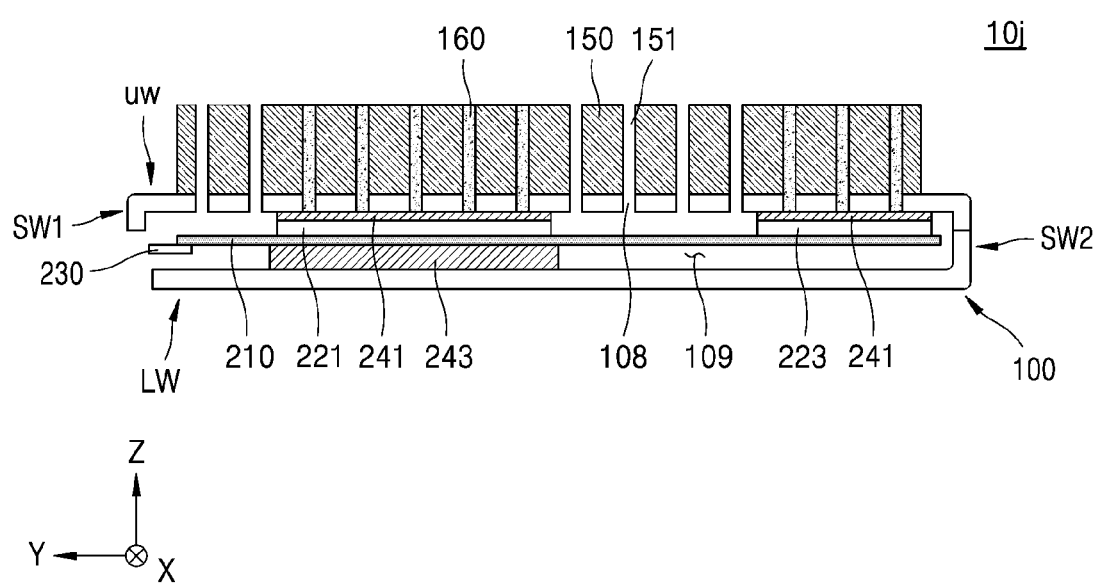
FIG. 26 is a cross-sectional view illustrating an SSD apparatus according to example embodiments of the inventive concept.

FIG. 26 is a cross-sectional view illustrating an SSD apparatus 10*j* according to example embodiments of the inventive concept.

The SSD apparatus 10*j* shown in FIG. 26 may be substantially the same as or similar to the SSD apparatus 10*i* described with reference to FIG. 25 except that the SSD apparatus 10*j* further includes a heat-dissipating filler 160. For convenience of description, a difference from the SSD apparatus 10*i* described with reference to FIG. 25 will be mainly described and to the extent that description of other elements has been omitted, it may be assumed that these elements are at least similar to corresponding elements that have been described in detail elsewhere in the present disclosure.

Referring to FIG. 26, the SSD apparatus 10*j* may further include the heat-dissipating filler 160 filled in the air passage 151. The heat-dissipating filler 160 may be filled in the air passage 151 of the heat-dissipating fin 150 and the through hole 108 of the upper wall UW and may come in contact with a semiconductor chip (220 of FIG. 2). Heat generated from the semiconductor chip 220 may be conducted to the heat-dissipating filler 160 and then discharged to the outside.

The heat-dissipating filler 160 may include a material having a high thermal conductivity (e.g. a thermal conductivity of at least 10 W/m K). The thermal conductivity of the material forming the heat-dissipating filler 160 may be greater than a thermal conductivity of a material forming the heat-dissipating fin 150. The heat-dissipating filler 160 may include Cu but is not limited thereto. For example, the heat-dissipating filler 160 may include a thermally conductive liquid filler material.

According to example embodiments of the inventive concept, the heat-dissipating filler 160 may be disposed in the air passages 151 vertically overlapping the semiconductor chip 220 but might not be disposed in the other air passages 151, which do not overlap the semiconductor chip 220. In this case, heat of the semiconductor chip 220 may be discharged to the outside through the heat-dissipating filler 160 through conductive heat transfer, and air passages 151 without being filled with the heat-dissipating filler 160 may function as a chimney through which hot air in the accommodation space 109 flows out.

Figure 27:
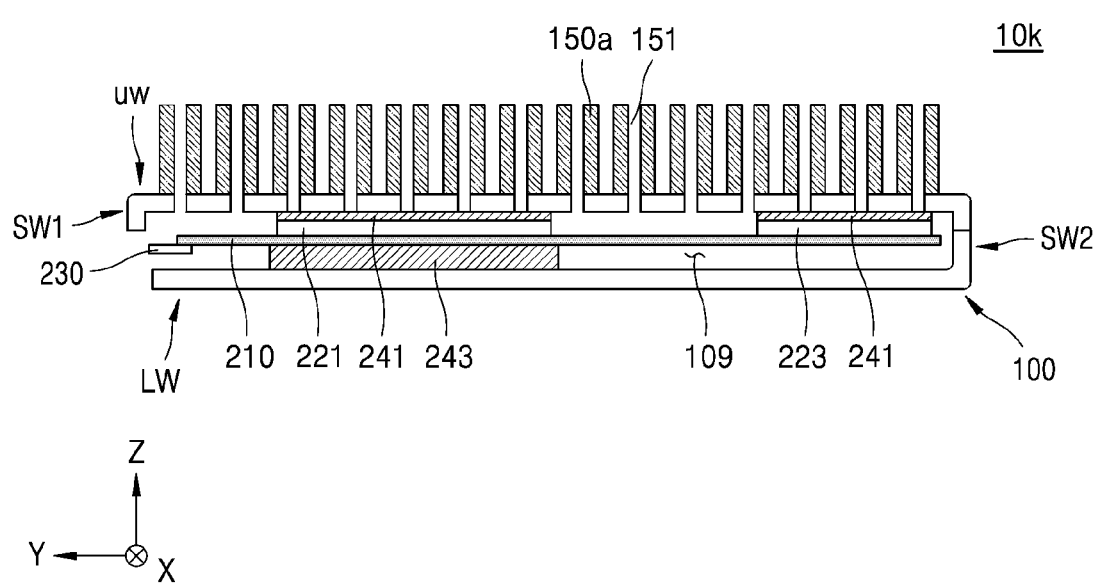
FIG. 27 is a cross-sectional view illustrating an SSD apparatus according to example embodiments of the inventive concept.

FIG. 27 is a cross-sectional view illustrating an SSD apparatus 10*k* according to example embodiments of the inventive concept.

The SSD apparatus 10*k* shown in FIG. 27 may be substantially the same as or similar to the SSD apparatus 10*g* described with reference to FIG. 23, from which the inner plate 110 and the air tunnels 130 are omitted. For convenience of description, a difference from the SSD apparatus 10*g* described with reference to FIGS. 22 and 23 will be mainly described and to the extent that description of other elements has been omitted, it may be assumed that these elements are at least similar to corresponding elements that have been described in detail elsewhere in the present disclosure.

Referring to FIG. 27, a semiconductor chip (220 of FIG. 2) mounted on the substrate 210, e.g., the controller chip 221 and the first memory semiconductor chip 223, may come in contact with the upper wall UW. The first thermal interface material 241 may be disposed between the controller chip 221 and the upper wall UW and the first memory semiconductor chip 223 and the upper wall UW.

The air passage 151 of the heat-dissipating fin 150*a* may communicate with the accommodation space 109 in the case 100 in which the substrate 210 and the like are accommodated. The air passage 151 may communicate with the accommodation space 109 in the case 100 through the through hole 108 formed in the upper wall UW. Hot air in the case 100 heated by the semiconductor chip (220 of FIG. 2) and the like may be discharged to the outside of the case 100 through the through hole 108 of the upper wall UW and the air passage 151 of the heat-dissipating fin 150*a*.

Although not shown in FIG. 27, according to example embodiments of the inventive concept, the heat-dissipating filler 160 described above with reference to FIG. 26 may be filled in the air passage 151 of the heat-dissipating fin 150*a*.

Figure 28:
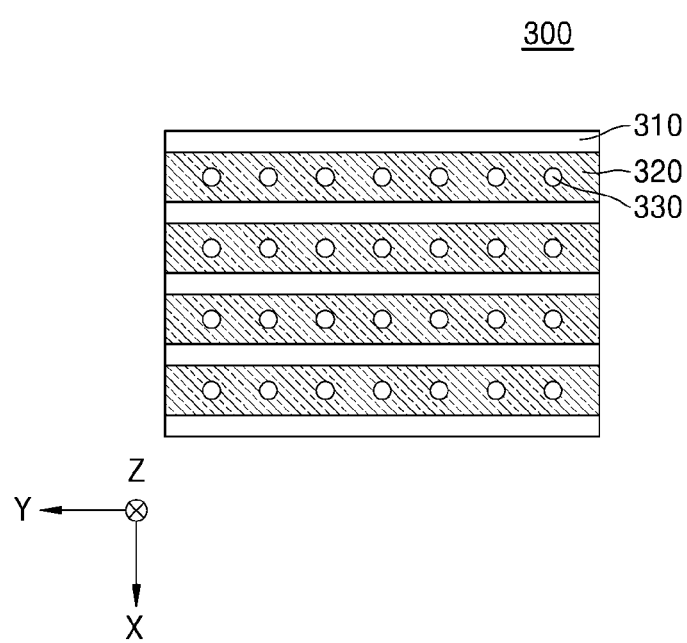
FIG. 28 is a top view illustrating a heat-dissipating apparatus according to example embodiments of the inventive concept.
Figure 29:
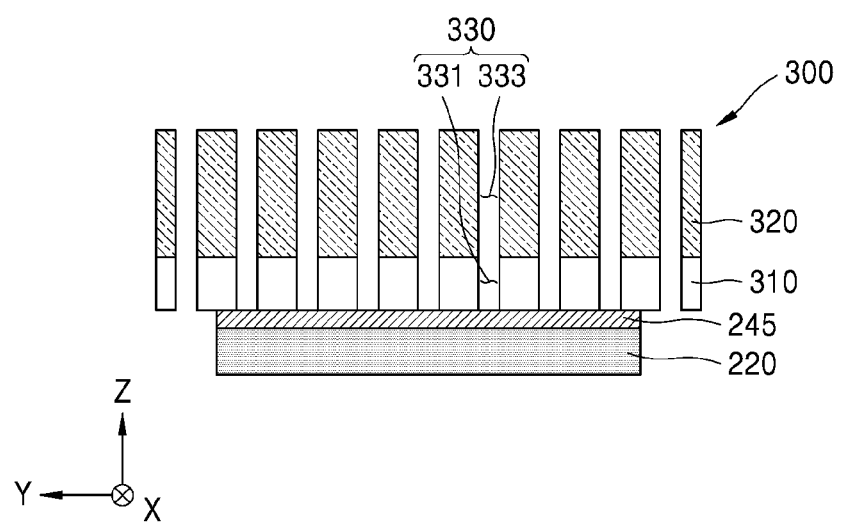
FIG. 29 is a cross-sectional view illustrating a heat-dissipating apparatus according to example embodiments of the inventive concept.

FIG. 28 is a top view illustrating a heat-dissipating apparatus 300 according to example embodiments of the inventive concept. FIG. 29 is a cross-sectional view illustrating the heat-dissipating apparatus 300 according to example embodiments of the inventive concept.

Referring to FIGS. 28 and 29, the heat-dissipating apparatus 300 may be attached to an object of which heat dissipation is needed and used to discharge heat of the object. For example, the heat-dissipating apparatus 300 may be attached onto the semiconductor chip 220 to discharge heat generated within the semiconductor chip 220.

According to example embodiments of the inventive concept, the heat-dissipating apparatus 300 may include a base 310 and a plurality of heat-dissipating fins 320. The base 310 may be attached to the semiconductor chip 220 and have a plate-like shape. The plurality of heat-dissipating fins 320 may be disposed on the base 310. For example, the heat-dissipating fin 320 may have a line shape extending in the first direction (e.g., the Y direction) from a first edge of the base 310 toward a second edge opposite to the first edge in a top view.

The plurality of heat-dissipating fins 320 may be spaced apart from each other at constant intervals and may be disposed in parallel to each other on the base 310. A groove through which air flows may be formed between two neighboring heat-dissipating fins 320.

Each of the base 310 and the heat-dissipating fin 320 may include a material having an excellent thermal conductivity. For example, each of the base 310 and the heat-dissipating fin 320 may include a material having a thermal conductivity of 10 W/mK or higher. For example, each of the base 310 and the heat-dissipating fin 320 may include Cu, Ni, gold (Au), W, and/or Al. In addition, according to example embodiments of the inventive concept, each of the base 310 and the heat-dissipating fin 320 may include a carbon-based synthetic material, e.g., graphite, graphene, a carbon fiber, a carbon nanotube composite, or the like. However, a material constituting the base 310 and a material constituting the heat-dissipating fin 320 are not limited to the materials described above.

The heat-dissipating apparatus 300 may include an air passage 330 penetrating the base 310 and the heat-dissipating fin 320. The air passage 330 may include a first air passage 331 penetrating the base 310 and a second air passage 333 penetrating the heat-dissipating fin 320.

In more detail, the first air passage 331 of the base 310 may penetrate into the base 310 by extending from a lower surface of the base 310 to an upper surface of the base 310. By the first air passage 331 of the base 310, the surface of the semiconductor chip 220 may be exposed. The first air passage 331 of the base 310 may function as a passage through which heat generated by the semiconductor chip 220 is discharged to the outside.

The second air passage 333 formed in the heat-dissipating fin 320 may communicate with the first air passage 331 and be exposed to the outside. The second air passage 333 of the heat-dissipating fin 320 may function, together with the first air passage 331 of the base 310, as a passage through which heat generated by the semiconductor chip 220 is discharged to the outside. The second air passage 333 of the heat-dissipating fin 320 and the first air passage 331 of the base 310 may cooperatively function as a chimney through which hot air heated by the semiconductor chip 220 is discharged upwardly.

A thermal interface material 245 may be disposed between the base 310 of the heat-dissipating apparatus 300 and the semiconductor chip 220. The thermal interface material 245 may reinforce thermal coupling between the base 310 of the heat-dissipating apparatus 300 and the semiconductor chip 220.

Figure 30:
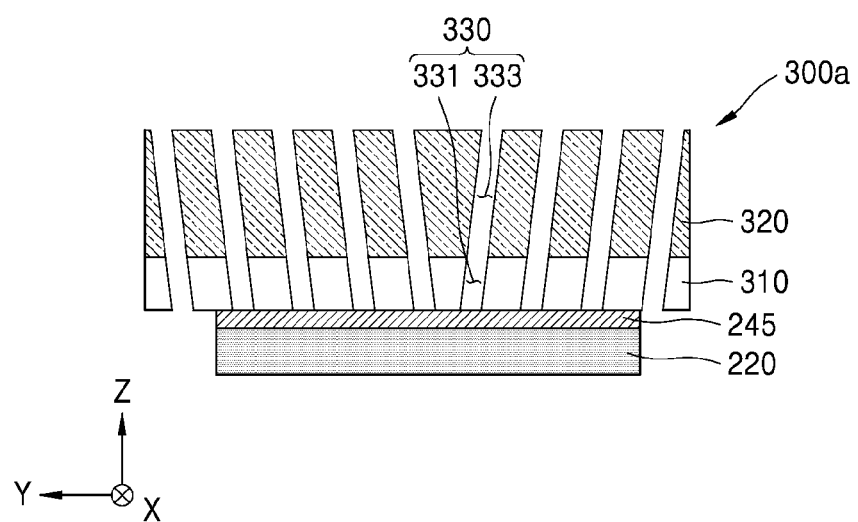
FIG. 30 is a cross-sectional view illustrating a heat-dissipating apparatus according to example embodiments of the inventive concept.

FIG. 30 is a cross-sectional view illustrating a heat-dissipating apparatus 300a according to example embodiments of the inventive concept.

The heat-dissipating apparatus 300a shown in FIG. 30 may be substantially the same as or similar to the heat-dissipating apparatus 300 described with reference to FIGS. 28 and 29 except for an extending direction of the air passage 330. For convenience of description, a difference from the heat-dissipating apparatus 300 described with reference to FIGS. 28 and 29 will be mainly described and to the extent that description of other elements has been omitted, it may be assumed that these elements are at least similar to corresponding elements that have been described in detail elsewhere in the present disclosure.

Referring to FIG. 30, the air passage 330 of the heat-dissipating fin 320 may extend upward to be inclined. For example, the air passage 330 of the heat-dissipating fin 320 may extend primarily in an inclined direction with respect to a direction (e.g., the Z direction) orthogonal to the upper surface of the base 310. When the air passage 330 of the heat-dissipating fin 320 extends to be inclined, inflow of external foreign substances to the air passage 330 may be suppressed.

Figure 31:
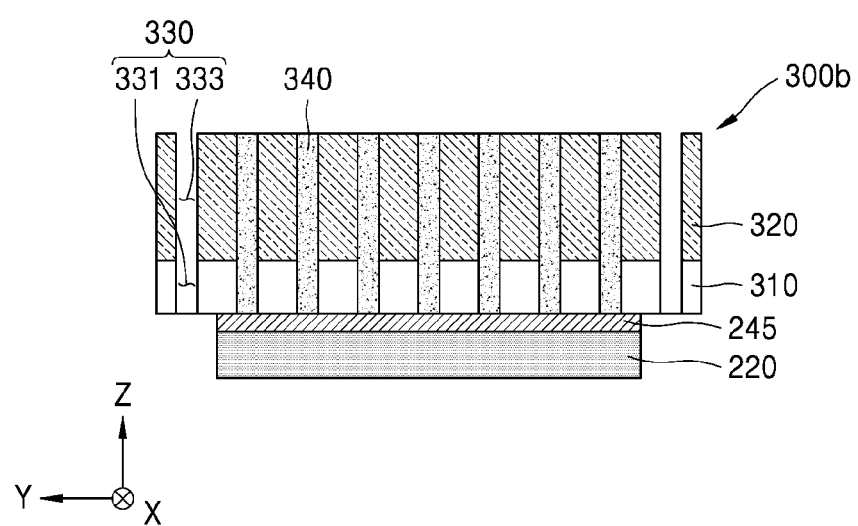
FIG. 31 is a cross-sectional view illustrating a heat-dissipating apparatus according to example embodiments of the inventive concept.

FIG. 31 is a cross-sectional view illustrating a heat-dissipating apparatus 300b according to example embodiments of the inventive concept.

The heat-dissipating apparatus 300b shown in FIG. 31 may be substantially the same as or similar to the heat-dissipating apparatus 300 described with reference to FIGS. 28 and 29 except that the heat-dissipating apparatus 300b further includes a heat-dissipating filler 340. For convenience of description, a difference from the heat-dissipating apparatus 300 described with reference to FIGS. 28 and 29 will be mainly described and to the extent that description of other elements has been omitted, it may be assumed that these elements are at least similar to corresponding elements that have been described in detail elsewhere in the present disclosure.

Referring to FIG. 31, the heat-dissipating apparatus 300b may further include the heat-dissipating filler 340 filled in the air passage 330 of the heat-dissipating fin 320. The heat-dissipating filler 340 may be filled in the air passage 330 so as to come in contact with the semiconductor chip 220. Heat generated from the semiconductor chip 220 may be conducted to the heat-dissipating filler 340 and then discharged to the outside.

The heat-dissipating filler 340 may include a material having a relatively high thermal conductivity (e.g. a thermal conductivity of at least 10 W/m K). The thermal conductivity of the material forming the heat-dissipating filler 340 may be greater than a thermal conductivity of a material forming the heat-dissipating fin 320. The heat-dissipating filler 340 may include Cu but is not limited thereto. For example, the heat-dissipating filler 340 may include a thermally conductive liquid filler material.

According to example embodiments of the inventive concept, the heat-dissipating filler 340 may be disposed in the air passages 330 vertically overlapping the semiconductor chip 220 but might not be disposed in the other air passages 330 which do not overlap the semiconductor chip 220. In this case, heat of the semiconductor chip 220 may be discharged to the outside through the heat-dissipating filler 340 through conductive heat transfer, and air passages 330 without being filled with the heat-dissipating filler 340 may function as a chimney through which air flows.

Figure 32:
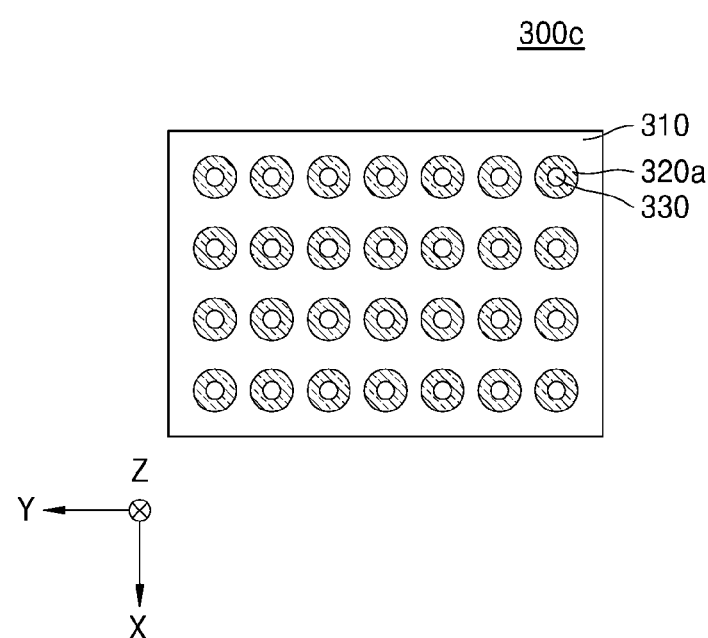
FIG. 32 is a cross-sectional view illustrating a heat-dissipating apparatus according to example embodiments of the inventive concept.
Figure 33:
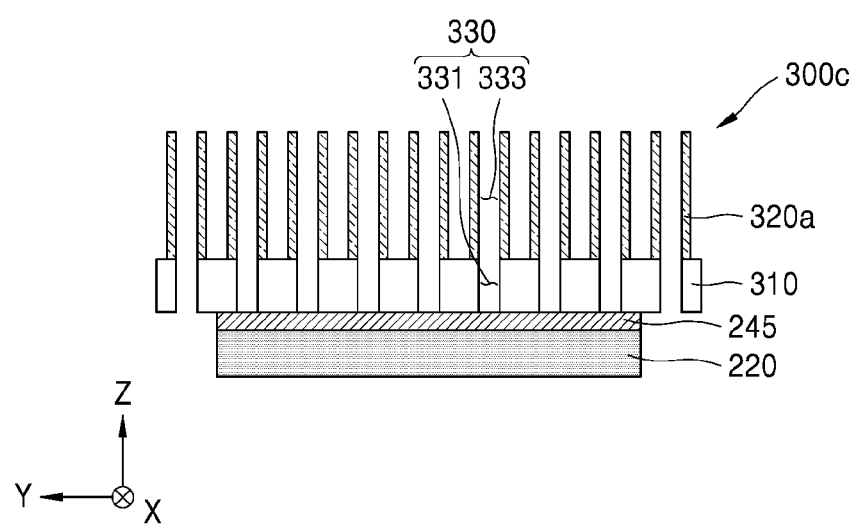
FIG. 33 is a cross-sectional view illustrating a heat-dissipating apparatus according to example embodiments of the inventive concept.

FIG. 32 is a cross-sectional view illustrating a heat-dissipating apparatus 300c according to example embodiments of the inventive concept. FIG. 33 is a cross-sectional view illustrating the heat-dissipating apparatus 300c according to example embodiments of the inventive concept.

The heat-dissipating apparatus 300c shown in FIGS. 32 and 33 may be substantially the same as or similar to the heat-dissipating apparatus 300 described with reference to FIGS. 28 and 29 except for a structure of a heat-dissipating fin 320a. For convenience of description, a difference from the heat-dissipating apparatus 300 described with reference to FIGS. 28 and 29 will be mainly described and to the extent that description of other elements has been omitted, it may be assumed that these elements are at least similar to corresponding elements that have been described in detail elsewhere in the present disclosure.

Referring to FIGS. 32 and 33, a plurality of heat-dissipating fins 320a in a matrix form may be disposed on the base 310. The heat-dissipating fin 320a may have a pillar shape standing on the base 310. As shown in FIGS. 32 and 33, the heat-dissipating fin 320a may have a cylindrical shape of which a horizontal cross-section is circular. However, the shape of the heat-dissipating fin 320a is not limited thereto, and the horizontal cross-section of the heat-dissipating fin 320a may have a polygonal shape such as a triangular shape, a quadrangular shape, a pentagonal shape, or a hexagonal shape.

Although not shown in FIGS. 32 and 33, according to example embodiments of the inventive concept, the air passage 330 of the heat-dissipating fin 320a may be filled with a heat-dissipating filler described above with reference to FIG. 31.

Figure 34:
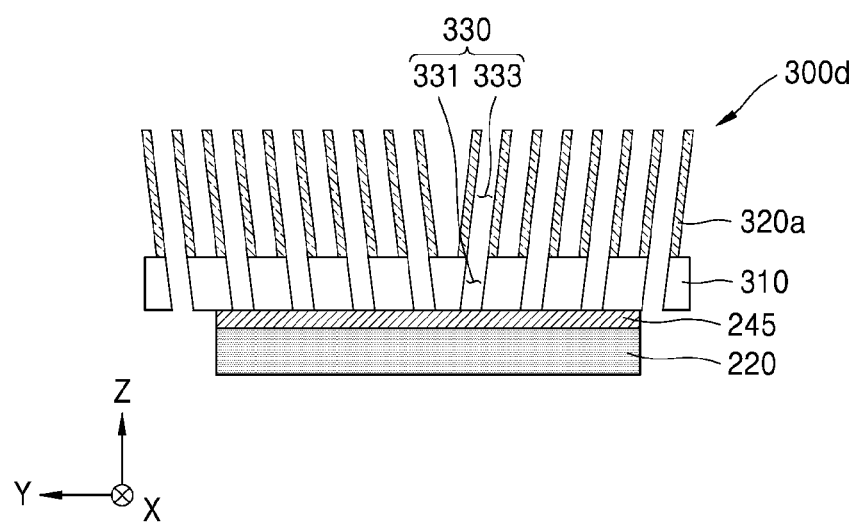
FIGS. 34 and 35 are cross-sectional views illustrating heat-dissipating apparatuses according to example embodiments of the inventive concept.
Figure 35:
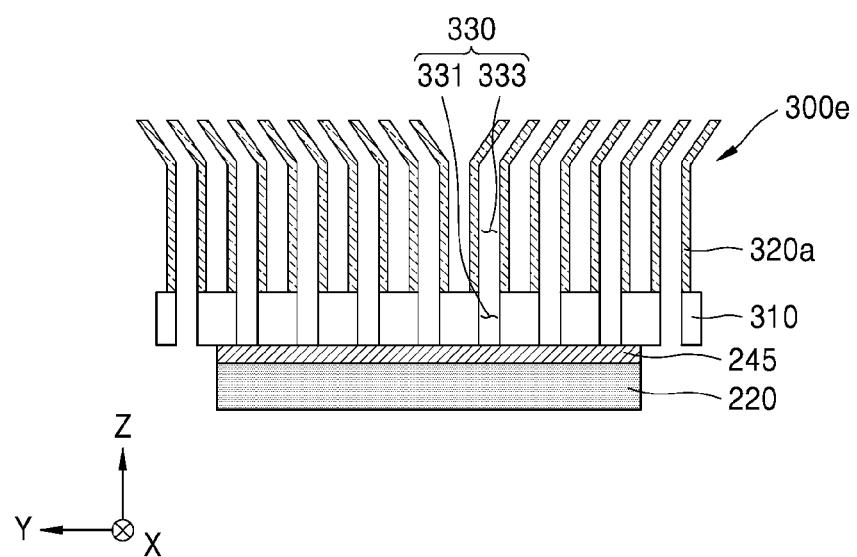

FIGS. 34 and 35 are cross-sectional views illustrating heat-dissipating apparatuses 300d and 300e according to example embodiments of the inventive concept. Hereinafter, a difference from the heat-dissipating apparatus 300c described with reference to FIGS. 32 and 33 will be mainly described and to the extent that description of other elements has been omitted, it may be assumed that these elements are at least similar to corresponding elements that have been described in detail elsewhere in the present disclosure.

Referring to FIG. 34, the heat-dissipating fin 320a of the heat-dissipating apparatus 300d may extend primarily in an inclined direction with respect to a direction (e.g., the Z direction) orthogonal to the upper surface of the base 310. The air passage 330 of the heat-dissipating fin 320a may also extend primarily in the inclined direction with respect to the direction orthogonal to the upper surface of the base 310 along the extending direction of the heat-dissipating fin 320a. When the heat-dissipating fin 320a and the air passage 330 are inclined, inflow of external foreign substances to the air passage 330 may be suppressed.

As shown in FIG. 34, an upper surface of the heat-dissipating fin 320a may have a flat shape and be parallel to the upper surface of the base 310. According to other example embodiments of the inventive concept, unlike that shown in FIG. 34, the heat-dissipating fin 320a may have an upper surface of a non-flat shape. For example, the upper surface of the heat-dissipating fin 320a might not be parallel to the upper surface of the base 310. The upper surface of the heat-dissipating fin 320a may be inclined. When the upper surface of the heat-dissipating fin 320a is inclined, inflow of external foreign substances to the air passage 330 may be suppressed.

Referring to FIG. 35, the heat-dissipating fin 320a of the heat-dissipating apparatus 300e may have a bending portion at an upper part thereof. For example, the heat-dissipating fin 320a may extend primarily in the vertical direction orthogonal to the upper surface of the base 310 from the upper surface of the base 310 to the bending portion, and the bending portion may be inclined at a certain angle with respect to the vertical direction. When the heat-dissipating fin 320a includes the inclined bending portion, inflow of external foreign substances to the air passage 330 may be suppressed.

Figure 36:
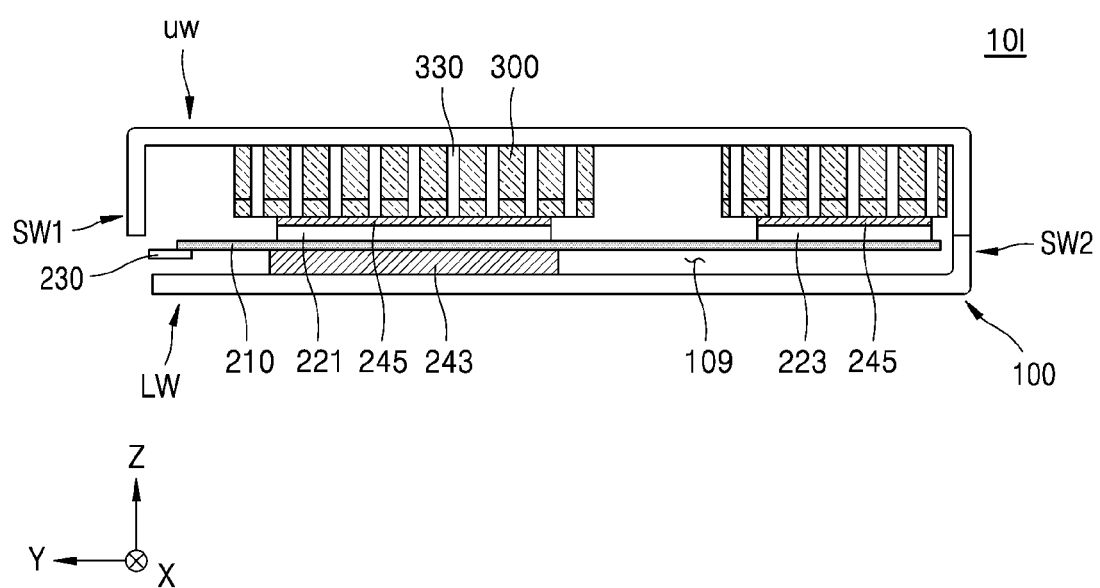
FIGS. 36 to 38 are cross-sectional views illustrating SSD apparatuses according to example embodiments of the inventive concept.
Figure 37:
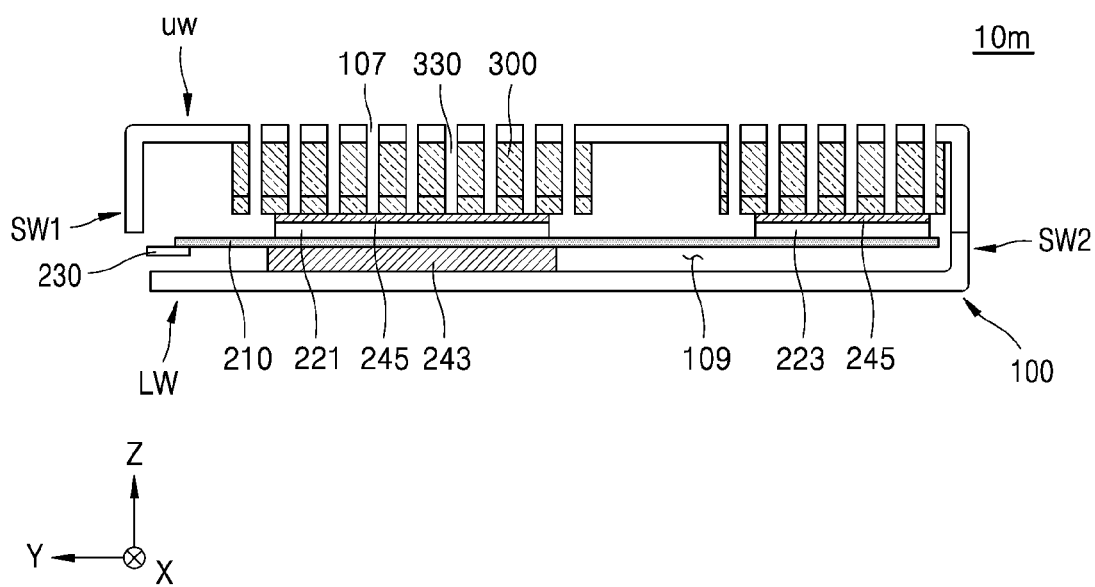
Figure 38:
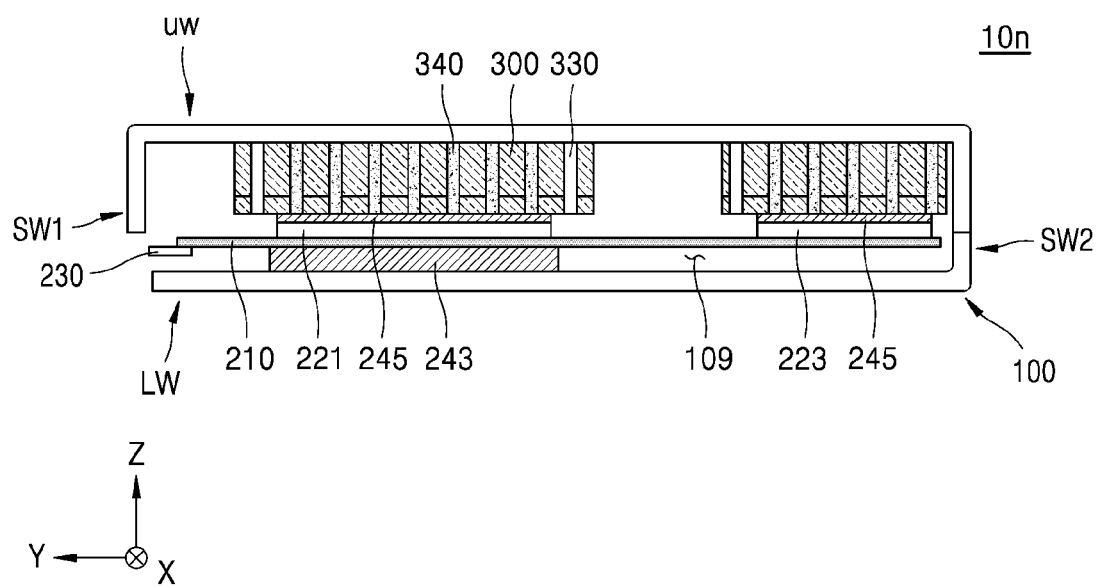

FIGS. 36 to 38 are cross-sectional views illustrating SSD apparatuses 10l, 10m, and 10n according to example embodiments of the inventive concept.

Although FIGS. 36 and 37 show that each of the SSD apparatuses 10l and 10m includes the heat-dissipating apparatus 300 described with reference to FIGS. 28 and 29, but the SSD apparatuses 10l and 10m are not limited thereto. Although FIG. 38 show that the SSD apparatus 10n includes the heat-dissipating apparatus 300b described with reference to FIG. 31, but the SSD apparatus 10n is not limited thereto. For example, the SSD apparatuses 10l, 10m, and 10n may include the heat-dissipating apparatuses 300a, 300b, 300c, 300d, and 300e described with reference to FIGS. 30 to 35.

Referring to FIG. 36, the SSD apparatus 10l may include the case 100, the substrate 210 in the accommodation space 109 of the case 100, a semiconductor chip (220 of FIG. 2) on the substrate 210, and the heat-dissipating apparatus 300 on the semiconductor chip 220. An upper end of the heat-dissipating fin 320 of the heat-dissipating apparatus 300 may come in contact with an inner wall of the case 100 to transfer heat of the semiconductor chip 220 to the case 100.

Referring to FIG. 37, the case 100 of the SSD apparatus 10m may have a through hole 107 communicating with the air passage 330 of the heat-dissipating apparatus 300. In this case, air heated by a semiconductor chip (220 of FIG. 2) such as the controller chip 221 or the first memory semiconductor chip 223 may be discharged to the outside of the case through the air passage 330 of the heat-dissipating apparatus 300 and the through hole 107 of the case 100.

Referring to FIG. 38, the heat-dissipating apparatus 300 of the SSD apparatus 10n may include the heat-dissipating filler 340 filled in the air passage 330. A lower end of the heat-dissipating filler 340 may come in contact with a semiconductor chip (220 of FIG. 2), and an upper end of the heat-dissipating filler 340 may come in contact with the inner wall of the case 100. In this case, heat of the semiconductor chip 220 may be quickly transferred to the case 100 through the heat-dissipating filler 340.

Figure 39:
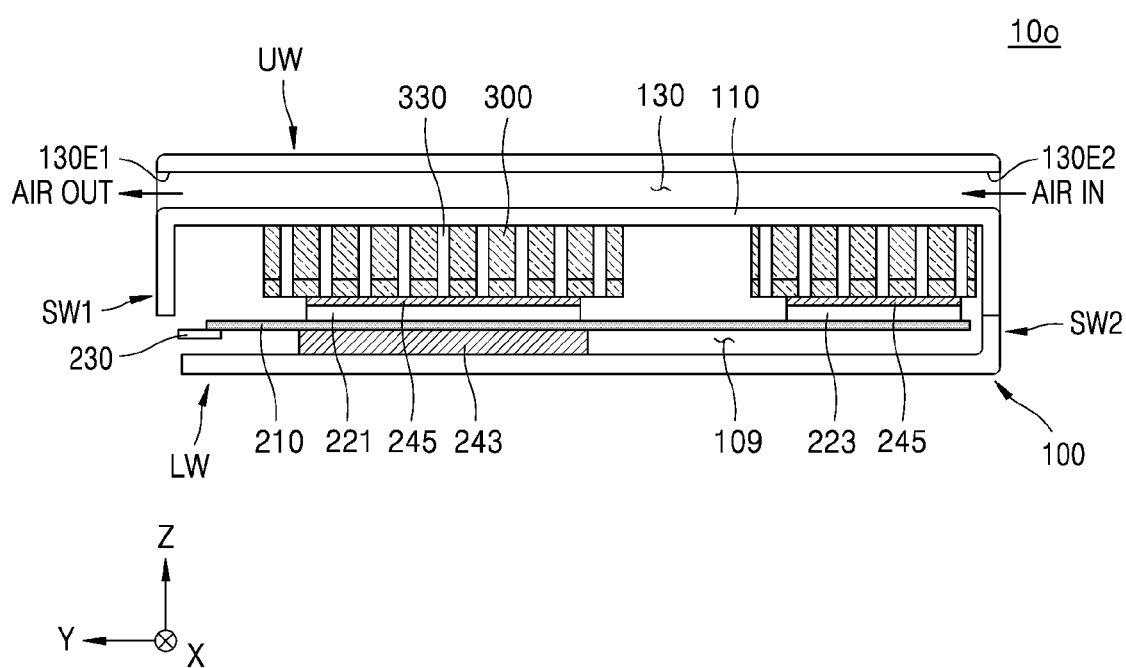
FIG. 39 is a cross-sectional view illustrating an SSD apparatus according to example embodiments of the inventive concept.

FIG. 39 is a cross-sectional view illustrating an SSD apparatus 10o according to example embodiments of the inventive concept.

The SSD apparatus 10o shown in FIG. 39 may be substantially the same as or similar to the SSD apparatus 10 described with reference to FIGS. 1 to 4 except that the SSD apparatus 10o further includes the heat-dissipating apparatus 300. For convenience of description, a difference from the SSD apparatus 10 described with reference to FIGS. 1 to 4 will be mainly described and to the extent that description of other elements has been omitted, it may be assumed that these elements are at least similar to corresponding elements that have been described in detail elsewhere in the present disclosure.

Referring to FIG. 39, the heat-dissipating apparatus 300 may be attached onto a semiconductor chip (220 of FIG. 2) and come in contact with the inner plate 110 of the case 100. The heat-dissipating apparatus 300 may transfer heat generated from the semiconductor chip (220 of FIG. 2) to the inner plate 110. The heat transferred to the inner plate 110 through the heat-dissipating apparatus 300 may be effectively removed by air flowing through the air tunnel 130.

FIG. 39 shows that the SSD apparatus 10o includes the heat-dissipating apparatus 300 described with reference to FIGS. 28 and 29. However, the SSD apparatus 10o is not limited thereto and may include the heat-dissipating apparatuses 300a, 300b, 300c, 300d, and 300e described with reference to FIGS. 31 to 35.

Figure 40:
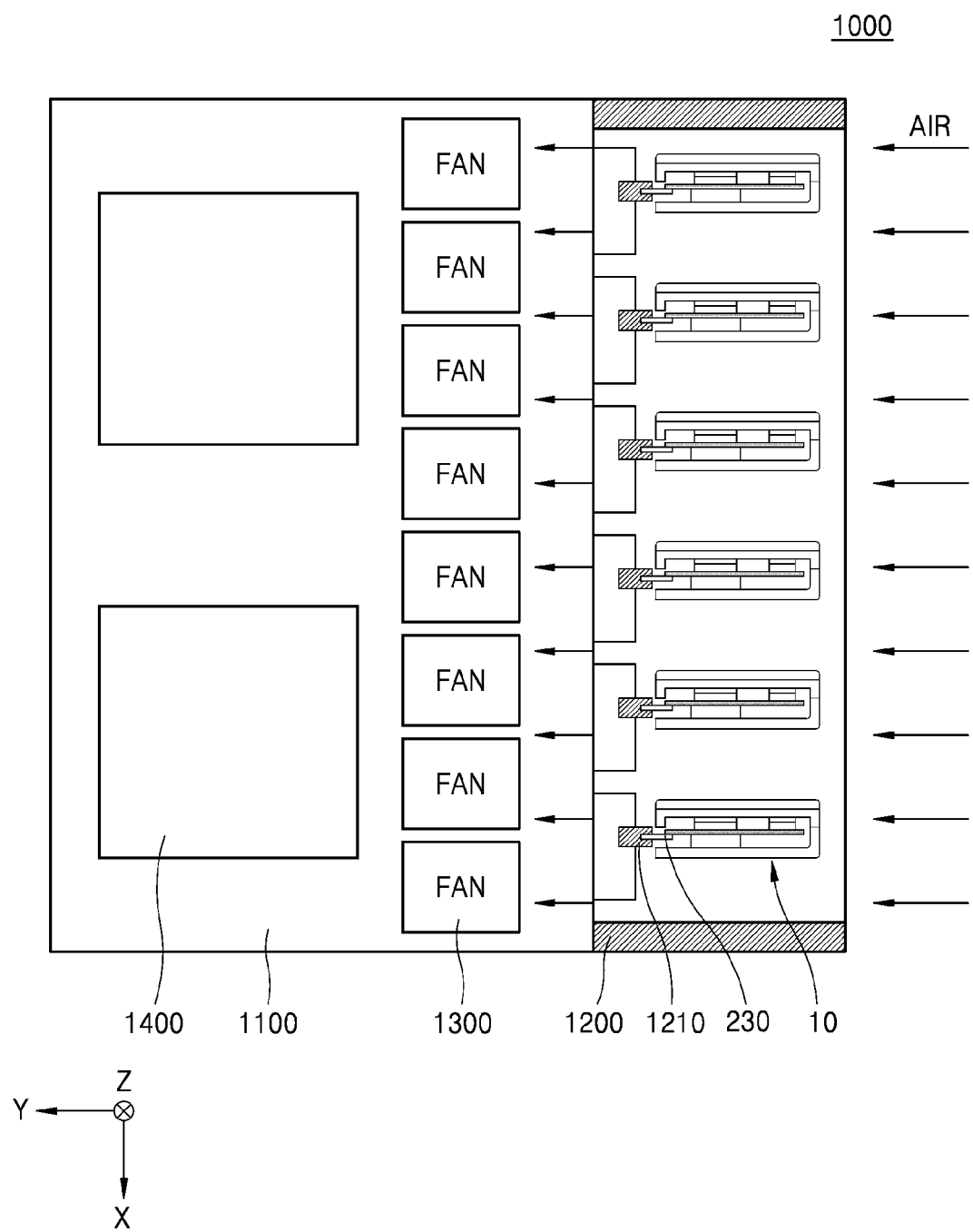
FIG. 40 is a block diagram illustrating a data storage apparatus according to example embodiments of the inventive concept.

FIG. 40 is a block diagram illustrating a data storage apparatus 1000 according to example embodiments of the inventive concept.

Referring to FIG. 40 together with FIGS. 1 to 4, the data storage apparatus 1000 may include, for example, a direct attached storage (DAS), network attached storage (NAS), or a storage area network (SAN). The data storage apparatus 1000 may include a rack 1200 equipped with the SSD apparatus 10 such as an SSD and a cooling fan 1300 disposed to be adjacent to the rack 1200. The rack 1200 and the cooling fan 1300 may be disposed on a support substrate 1100 such as a PCB. In addition, the SSD apparatus 10 may further include a power supply unit 1400 configured to supply power required to operate the data storage apparatus 1000 and a processing unit such as a CPU configured to control an operation of the data storage apparatus 1000.

The rack 1200 may include a plurality of sockets 2120 spaced apart from each other in the second direction (e.g., the X direction), and may equipped with a plurality of SSD apparatuses 10 spaced apart from each other in the second direction. The SSD apparatus 10 may be slid in, for example, the first direction (e.g., the Y direction) and coupled to the socket 1210 in the rack 1200. When the external connector 230 of the SSD apparatus 10 is coupled to the socket 1210, the SSD apparatus 10 may be physically and electrically connected to the socket 1210.

The cooling fan 1300 may provide a forced convection environment to the inside of the data storage apparatus 1000. For example, the cooling fan 1300 may form an air flow in the first direction (e.g., the Y direction) in the data storage apparatus 1000. According to example embodiments of the inventive concept, the SSD apparatus 10 may be accommodated in the rack 1200 such that the direction of the air flow formed by the cooling fan 1300 is parallel to an extending direction of the air tunnel 130 of the case 100. Air introduced by the cooling fan 1300 may effectively cool down the SSD apparatus 10 while flowing along the air tunnel 130 of the case 100, and thus, a heat-dissipating characteristic of the SSD apparatus 10 may be increased. Accordingly, the reliability of the SSD apparatus 10 and the data storage apparatus 1000 including the same may be increased.

While the inventive concept has been particularly shown and described with reference to embodiments thereof, it will be understood that various changes in form and details may be made therein without departing from the spirit and scope of the following claims.

What is claimed is:

1. A solid state drive (SSD) apparatus, comprising:
   a case comprising a plurality of air tunnels disposed between an inner plate of the case and an upper wall of the case, the case further comprising an accommodation space defined between the inner plate and a lower wall of the case, each of the plurality of air tunnels extending in a first direction, and two end portions of each of the plurality of the air tunnels being exposed to an outside of the case;
   a substrate disposed within the accommodation space; and
   a plurality of semiconductor chips disposed between the substrate and the inner plate,
   wherein neighboring air tunnel pairs from among the plurality of air tunnels are separated from each other by separation walls extending in the first direction, each of the separation walls continuously and directly connected to the inner plate and the upper wall,
   wherein at least some of the plurality of air tunnels overlap a top surface of a single chip of the plurality of semiconductor chips in a cross-sectional view of the SSD apparatus with a thermal interface material disposed therebetween,
   wherein the plurality of semiconductor chips comprises a controller chip and a nonvolatile memory semiconductor chip, and
   wherein the inner plate comprises a vent hole disposed between the controller chip and the nonvolatile memory semiconductor chip, in the cross-sectional view of the SSD apparatus, the vent hole connecting one of the plurality of air tunnels to a portion of the accommodation space that is disposed at a level that is lower than that of the plurality of semiconductor chips and the substrate.

2. The SSD apparatus of claim 1, wherein the case further comprises a first side wall and a second side wall facing each other, and
   wherein each of the separation walls extends from the first side wall to the second side wall.

3. The SSD apparatus of claim 2, further comprising an external connector mounted at a first edge of the substrate, which faces the first side wall of the case, wherein the external connector is connected to an external device that is external to the SSD apparatus.

4. The SSD apparatus of claim 1, wherein t case further comprises:
   a first side wall and a second side wall facing each other, and a third side wall and a fourth side wall facing each other, and
   wherein each of the separation walls extends from the third side wall to the fourth side wall, and
   wherein the SSD apparatus further comprises an external connector mounted at a first edge of the substrate, which faces the first side wall of the case.

5. The SSD apparatus of claim 1, wherein the single chip is coupled to the inner plate through the thermal interface material.

6. The SSD apparatus of claim 1, wherein a width of each of the plurality of air tunnels varies in the first direction.

* * * * *